US010515830B2

(12) United States Patent
Yamagishi et al.

(10) Patent No.: US 10,515,830 B2
(45) Date of Patent: Dec. 24, 2019

(54) FIRST PROTECTIVE FILM-FORMING SHEET, METHOD FOR FORMING FIRST PROTECTIVE FILM, AND METHOD FOR MANUFACTURING SEMICONDUCTOR CHIP

(71) Applicant: LINTEC Corporation, Tokyo (JP)

(72) Inventors: Masanori Yamagishi, Phoenix, AZ (US); Akinori Sato, Saitama (JP)

(73) Assignee: LINTEC CORPORATION, Tokyo (JP)

( * ) Notice: Subject to any disclaimer, the term of this patent is extended or adjusted under 35 U.S.C. 154(b) by 0 days.

(21) Appl. No.: 15/769,167

(22) PCT Filed: Nov. 2, 2016

(86) PCT No.: PCT/JP2016/082529
§ 371 (c)(1),
(2) Date: Apr. 18, 2018

(87) PCT Pub. No.: WO2017/078047
PCT Pub. Date: May 11, 2017

(65) Prior Publication Data
US 2018/0323084 A1 Nov. 8, 2018

(30) Foreign Application Priority Data
Nov. 4, 2015 (JP) .................. 2015-217114

(51) Int. Cl.
*H01L 21/56* (2006.01)
*H01L 21/683* (2006.01)
(Continued)

(52) U.S. Cl.
CPC ............ *H01L 21/568* (2013.01); *B32B 27/00* (2013.01); *B32B 37/025* (2013.01); *C09J 5/00* (2013.01);
(Continued)

(58) Field of Classification Search
CPC ..... H01L 21/568; H01L 21/78; H01L 21/563; H01L 21/56; H01L 23/29; H01L 21/304;
(Continued)

(56) References Cited

U.S. PATENT DOCUMENTS

2005/0008873 A1* 1/2005 Noro ................... B32B 27/08
428/423.1
2012/0208009 A1 8/2012 Oda et al.
(Continued)

FOREIGN PATENT DOCUMENTS

JP 2005-028734 2/2005
JP 2012-169482 9/2012
(Continued)

OTHER PUBLICATIONS

International Search Report for PCT/JP2016/082529 dated Dec. 20, 2016, 4 pages.
(Continued)

Primary Examiner — Sonya D. McCall-Shepard
(74) Attorney, Agent, or Firm — Nixon & Vanderhye P.C.

(57) ABSTRACT

The present invention relates to a first protective film-forming sheet formed by stacking a first pressure-sensitive adhesive layer on a first base material and stacking a curable resin layer on the first pressure-sensitive adhesive layer, in which the curable resin layer is a layer to form a first protective film on a bump-provided surface of a semiconductor wafer by being attached to the surface and cured, a sum of a thickness of the curable resin layer and a thickness of a first pressure-sensitive adhesive layer is 110 μm or more, and the thickness of the curable resin layer is 20 μm to 100 μm.

9 Claims, 3 Drawing Sheets

(51) Int. Cl.

| | | |
|---|---|---|
| *H01L 23/31* | (2006.01) | |
| *C09J 7/40* | (2018.01) | |
| *B32B 37/00* | (2006.01) | |
| *C09J 5/06* | (2006.01) | |
| *H01L 21/78* | (2006.01) | |
| *C09J 7/29* | (2018.01) | |
| *C09J 7/20* | (2018.01) | |
| *H01L 21/304* | (2006.01) | |
| *B32B 27/00* | (2006.01) | |
| *C09J 5/00* | (2006.01) | |
| *C09J 201/00* | (2006.01) | |
| *C09J 7/38* | (2018.01) | |

(52) U.S. Cl.
 CPC . *C09J 5/06* (2013.01); *C09J 7/20* (2018.01); *C09J 7/29* (2018.01); *C09J 7/38* (2018.01); *C09J 7/401* (2018.01); *C09J 201/00* (2013.01); *H01L 21/304* (2013.01); *H01L 21/563* (2013.01); *H01L 21/6836* (2013.01); *H01L 21/78* (2013.01); *H01L 23/3157* (2013.01); *B32B 2457/14* (2013.01); *C09J 2423/006* (2013.01); *C09J 2463/005* (2013.01); *C09J 2467/006* (2013.01); *C09J 2475/00* (2013.01); *H01L 2221/6834* (2013.01); *H01L 2221/68327* (2013.01); *H01L 2221/68377* (2013.01); *H01L 2224/13022* (2013.01); *H01L 2224/13111* (2013.01); *H01L 2224/94* (2013.01)

(58) Field of Classification Search
 CPC ................ H01L 23/31; H01L 2224/94; H01L 2224/13111; H01L 2224/13022; B32B 37/025; B32B 27/00; C09J 5/06; C09J 2463/005; C09J 7/29; C09J 7/401; C09J 7/38; C09J 7/20; C09J 5/00; C09J 201/00
 See application file for complete search history.

(56) References Cited

U.S. PATENT DOCUMENTS

| | | |
|---|---|---|
| 2012/0208350 A1 | 8/2012 | Oda et al. |
| 2016/0181140 A1 | 6/2016 | Moriyama et al. |

FOREIGN PATENT DOCUMENTS

| | | |
|---|---|---|
| JP | 2012-169484 | 9/2012 |
| TW | 201109410 | 3/2011 |
| WO | 2015/145807 | 10/2015 |
| WO | WO 2015/162808 A1 | 10/2015 |

OTHER PUBLICATIONS

TW Office Action for TW105135055 (w/ English Translation) dated Dec. 27, 2017, 9 pages.
Extended European Search Report dated Apr. 24, 2019 in European Application No. 16862107.6, 8 pages.

* cited by examiner

PRIOR ART

FIRST PROTECTIVE FILM-FORMING SHEET, METHOD FOR FORMING FIRST PROTECTIVE FILM, AND METHOD FOR MANUFACTURING SEMICONDUCTOR CHIP

TECHNICAL FIELD

The present invention relates to a first protective film-forming sheet, a method for forming a first protective film, and a method for manufacturing a semiconductor chip.

This application is the U.S. national phase of International Application No. PCT/JP2016/082529 filed Nov. 2, 2016 which designated the U.S. and claims priority to Japanese Patent Application No. 2015-217114, filed on Nov. 4, 2015, the entire contents of each of which are incorporated herein by reference.

BACKGROUND ART

In the related art, in a case in which a multi-pin LSI package, which is used in MPU or a gate array, is mounted on a printed wiring board, a flip-chip mounting method in which a semiconductor chip in which convex electrodes (bumps) made of eutectic solder, high-temperature solder, gold, or the like are formed in connection pad portions is used, and these bumps are made to face, brought into contact with, and melting/diffusion-joined to the corresponding terminal portions on a chip-mounting substrate using a so-called face down method has been employed.

The semiconductor chip that is used in this mounting method is obtained by, for example, dividing a semiconductor wafer having bumps formed on a circuit surface by grinding a surface opposite to the circuit surface or dicing. In the process of obtaining the above-described semiconductor chip, generally, for the purpose of protecting the bump-formed surface of the semiconductor wafer, a curable resin film is attached to the bump-formed surface, and this film is cured so as to form a protective film on the bump-formed surface. As the above-described curable resin film, a curable resin film containing a thermosetting component that is cured by heating is broadly used, and, as a protective film-forming sheet including the above-described thermosetting resin film, a protective film-forming sheet formed by stacking a thermoplastic resin layer having a specific thermal elastic modulus on the film and further stacking a thermoplastic resin layer which is not plastic at 25° C. on the uppermost layer of the thermoplastic resin layer has been disclosed (refer to Patent Document 1).

In addition, according to Patent Document 1, this protective film-forming sheet is excellent in terms of the bump-filling property of the protective film, the wafer workability, the electric connection reliability after resin sealing, and the like.

CITATION LIST

Patent Documents

[Patent Document 1] Japanese Unexamined Patent Application, First Publication No. 2005-028734

SUMMARY OF THE INVENTION

Problems to be Solved by the Invention

However, in attempts to form the protective film on the bump-formed surface using the protective film-forming sheet including the curable resin film of the related art, there are cases in which a number of bump apexes that are poorly exposed are observed. In addition, there are cases in which the circuit surface or portions close to bumps are poorly filled with a curable resin and thus openings (also referred to as gaps) are generated in the protective film. When gaps are present in the protective film, there are cases in which the gaps themselves disable the circuit surface or bumps, particularly, bump base portions to be sufficiently protected with the protective film due to the degradation of the adhesion between the bump-formed surface and the protective film, the degradation of the protective film's capability of protecting the circuit surface and bumps, or the like. In addition, when gaps are present in the protective film, the gaps expand during the heating of the protective film by the reflow of solder or the like and thus the adhesion between the bump-formed surface and the protective film degrades, and, in a case in which the gaps abruptly expand, the protective film breaks, and thus the protective film and a semiconductor chip are separated from each other or the semiconductor chip breaks from the circuit surface, bumps, or the like. In addition, it is not clear whether or not the protective film disclosed by Patent Document 1 is capable of suppressing the generation of gaps.

The present invention has been made in consideration of the above-described circumstances, and an object of the present invention is to provide a first protective film-forming sheet that is excellent in terms of the bump apex exposure characteristics of a semiconductor wafer and a property of suppressing gaps in a first protective film.

Means to Solve the Problems

The present invention has the following aspects.

(1) A first protective film-forming sheet formed by stacking a first pressure-sensitive adhesive layer on a first base material and stacking a curable resin layer on the first pressure-sensitive adhesive layer, in which the curable resin layer is a layer to form a first protective film on a bump-provided surface of a semiconductor wafer by being attached to the surface and cured, a sum of a thickness of the curable resin layer and a thickness of the first pressure-sensitive adhesive layer is 110 μm or more, and the thickness of the curable resin layer is 20 μm to 100 μm;

(2) The first protective film-forming sheet according to (1), in which a wetting and spreading property of the curable resin layer at a temperature of 70° C., a load of 400 gf, and a retention time of five seconds is 110% to 300%;

(3) The first protective film-forming sheet according to (1) or (2), in which a shear elastic modulus of the first pressure-sensitive adhesive layer is $1.0 \times 10^3$ Pa to $1.0 \times 10^8$ Pa.

(4) A method for forming a first protective film that protects a circuit surface and bumps of a semiconductor wafer having the bumps formed on the circuit surface, the method including: a step of attaching a curable resin layer of a first protective film-forming sheet formed by stacking a first pressure-sensitive adhesive layer on a first base material and stacking the curable resin layer on the first pressure-sensitive adhesive layer to the bump-provided surface of the semiconductor wafer; a step of heating the curable resin layer; a step of laminating the circuit surface and the bumps of the semiconductor wafer; a step of forming a first protective film that protects the circuit surface and the bumps by curing the curable resin layer; and a step of peeling the first base material and the first pressure-sensitive adhesive layer, in which a sum of a thickness of the curable resin layer and a thickness of the first pressure-sensitive adhesive layer is 55% or more of a height of the bumps, and the thickness of the curable resin layer is 10% to 50% of the height of the bumps;

(5) The method for forming a first protective film according to (4), in which a wetting and spreading property of the curable resin layer at a temperature of 70° C., a load of 400 gf, and a retention time of five seconds is 110% to 300%;

(6) The method for forming a first protective film according to (4) or (5), in which a shear elastic modulus of the first pressure-sensitive adhesive layer is $1.0 \times 10^3$ Pa to $1.0 \times 10^8$ Pa;

(7) A method for manufacturing a semiconductor chip, the method including: a step of attaching a curable resin layer of a first protective film-forming sheet formed by stacking a first pressure-sensitive adhesive layer on a first base material and stacking the curable resin layer on the first pressure-sensitive adhesive layer to a bump-provided surface of a semiconductor wafer having bumps formed on a circuit surface; a step of heating the curable resin layer; a step of laminating the circuit surface and the bumps of the semiconductor wafer; a step of forming a first protective film that protects the circuit surface and the bumps by curing the curable resin layer; a step of peeling the first base material and the first pressure-sensitive adhesive layer; and a step of dicing and dividing the semiconductor wafer together with the first protective film, in which a sum of a thickness of the curable resin layer and a thickness of the first pressure-sensitive adhesive layer is 55% or more of a height of the bumps, and the thickness of the curable resin layer is 10% to 50% of the height of the bumps;

(8) The method for manufacturing a semiconductor chip according to (7), in which a wetting and spreading property of the curable resin layer at a temperature of 70° C., a load of 400 gf, and a retention time of five seconds is 110% to 300%; or (9) The method for manufacturing a semiconductor chip according to (7) or (8), in which a shear elastic modulus of the first pressure-sensitive adhesive layer is $1.0 \times 10^3$ Pa to $1.0 \times 10^8$ Pa.

Effects of the Invention

The first protective film-forming sheet of the present invention is excellent in terms of the bump apex exposure characteristic and the property of suppressing gaps in a first protective film.

EMBODIMENTS FOR CARRYING OUT THE INVENTION

Figure 1:
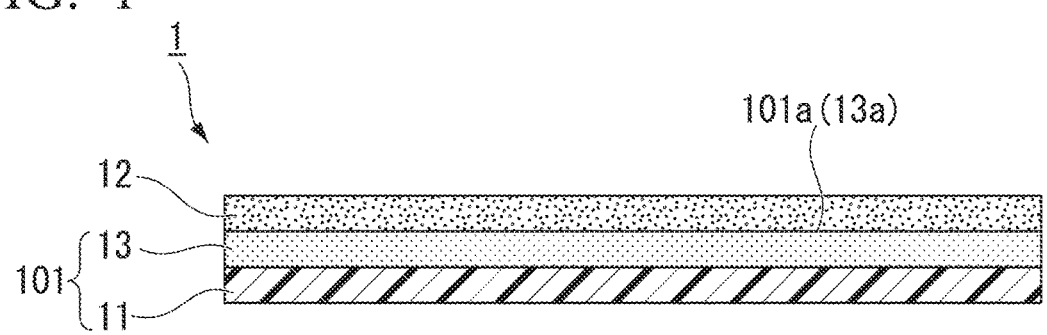
FIG. 1 is a cross-sectional view schematically illustrating an embodiment of a first protective film-forming sheet of the present invention.

A protective film-forming sheet of the present invention (also referred to as the first protective film-forming sheet) is used in a state of being attached to a bump-provided surface of a semiconductor wafer through a curable resin layer (also referred to as the curable resin film).

In addition, the attached curable resin layer becomes more fluid by heating, spreads among the bumps so as to cover the bumps, adheres to the circuit surface, and cover the surfaces of the bumps, particularly, the surfaces of portions close to the circuit surface, thereby burying the bumps. In a case in which the curable resin layer is a thermosetting resin layer, the curable resin layer in this state is further thermally cured by heating and forms a first protective film in the end, thereby protecting the bumps in a state of adhering to the surfaces of the bumps on the circuit surface. In the semiconductor wafer to which the first protective film-forming sheet has been attached, for example, a surface opposite to the circuit surface is ground, then, a first supporting sheet is removed, the circuit surface and the bumps are laminated by heating the thermosetting resin layer, the bumps are buried, the first protective film is formed, and, finally, the semiconductor wafer is combined into a semiconductor chip in a state of including this first protective film. In a case in which the curable resin layer is energy ray-curable, the curable resin layer can be cured by irradiation with energy rays instead of thermal curing by heating.

In a case in which the first protective film-forming sheet of the present invention is used, the first protective film also contains few or no gaps in the end, which alone enables the first protective film to sufficiently exhibit its functions such as high adhesion between the bump-formed surface and the first protective film and a high protective function of the first protective film for the circuit surface and the bumps. In addition, even when the first protective film is heated due to the reflow of solder or the like, the expansion of gaps does not occur or is suppressed, and thus the degradation of the adhesion between the bump-formed surface and the first protective film or the breakage of the first protective film is suppressed, the protective function of the first protective film is maintained, and the breakage of the semiconductor chip is suppressed. As described above, when the first protective film-forming sheet of the present invention is used, the circuit surface and the portions of the bumps close to the circuit surface, that is, base portions are sufficiently protected with the first protective film.

Hereinafter, the first protective film-forming sheet according to the present invention will be described in detail with reference to the accompanying drawings.

Meanwhile, in the drawings used in the following description, there are cases in which the first protective film-forming sheet is varied from the actual first protective film-forming sheet for convenience to make features clear. In addition, materials, conditions, and the like exemplified in the following description are simply examples, and the present invention is not limited thereto and can be carried out in appropriately modified manners within the scope of the gist of the present invention.

FIG. 1 is a cross-sectional view schematically illustrating an embodiment of the first protective film-forming sheet of the present invention.

A first protective film-forming sheet 1 of the present invention is a first protective film-forming sheet formed by stacking a first pressure-sensitive adhesive layer 13 on a first base material 11 and stacking a curable resin layer 12 on the first pressure-sensitive adhesive layer 13 as illustrated in FIG. 1, and the curable resin layer 12 is a layer intended to be attached to a bump-provided surface of a semiconductor wafer and be cured, thereby forming a first protective film on the surface. Hereinafter, in order to indicate the purpose of protecting the bump-provided surface of the semiconductor wafer, corresponding elements will be referred to as the first protective film, the first protective film-forming sheet, the first base material, the first pressure-sensitive adhesive layer, and the like. In addition, a portion of the sheet in which the first pressure-sensitive adhesive layer 13 is stacked on the first base material 11 will be referred to as the first supporting sheet 101 or the like.

⊗ First Supporting Sheet

The first supporting sheet may be a sheet made of a single layer (monolayer) or a sheet made of a plurality of layers (two or more layers). In a case in which the supporting sheet is made of a plurality of layers, the constituent materials and the thicknesses of the plurality of layers may be identical to or different from one another, and the combination of the plurality of layers is not particularly limited as long as the effects of the present invention are not impaired.

Meanwhile, in the present specification, the sentence "a plurality of layers may be identical to or different from one another" means that "all of the layers may be identical to one another, all of the layers may be different from one another, or only some of the layers may be identical to one another", and furthermore, the sentence "a plurality of layers is different from one another" means that "at least one of the constituent materials and the thicknesses of the respective layers are different from one another", which will be true not only for the first supporting sheet but also for other elements.

Examples of a preferred first supporting sheet include a first supporting sheet in which the first pressure-sensitive adhesive layer is stacked on the first base material, a first supporting sheet in which a first interlayer is stacked on the first base material and the first pressure-sensitive adhesive layer is stacked on the first interlayer, a first supporting sheet made of only the first base material, and the like; however, in the present invention, a first supporting sheet in which the first pressure-sensitive adhesive layer is stacked on the first base material is particularly preferred.

In a semiconductor wafer having bumps formed on a circuit surface to which the first protective film-forming sheet of the present invention is applied, the height of the bump is generally 180 µm to 220 µm, more preferably 190 µm to 210 µm, and particularly preferably 200 µm, among a plurality of bumps, the central pitch between adjacent bumps is 380 µm to 420 µm and more preferably 400 µm, and the diameter of the bump seen in the normal direction to the circuit surface is 225 µm to 275 µm and more preferably 250 µm. With respect to the height of the bump, the sum of the thickness of the curable resin layer 12 and the first pressure-sensitive adhesive layer 13 (in some cases, also referred to as the total thickness of the curable resin layer 12 and the first pressure-sensitive adhesive layer) is preferably 55% or more, more preferably 55% to 100%, still more preferably 55% to 85%, and particularly preferably 55% to 70%. That is, the sum of the thickness of the curable resin layer 12 and the first pressure-sensitive adhesive layer 13 is preferably 110 µm or more, more preferably 110 µm to 200 µm, still more preferably 110 µm to 170 µm, and particularly preferably 110 µm to 140 µm.

When the sum of the thickness of the curable resin layer 12 and the first pressure-sensitive adhesive layer 13 is in this range, during the lamination of the circuit surface and the bumps of the semiconductor wafer by attaching the curable resin layer 12 of the first protective film-forming sheet 1 to the bump-provided surface of the semiconductor wafer and heating the curable resin layer, the curable resin layer 12 spreads among the bumps so as to cover the bumps and adheres to the circuit surface, and thus the generation of gaps in the first protective film can be suppressed.

On the other hand, when the thickness of the curable resin layer 12 is too thick, the bumps are buried by the curable resin layer 12, and thus the bump apex exposure characteristic of the bumps deteriorates. Therefore, the thickness of the curable resin layer 12 is preferably 20 µm to 100 µm, more preferably 40 µm to 100 µm, and still more preferably 60 µm to 100 µm. When the thickness of the curable resin layer 12 is in this range, the bump apex exposure characteristic is favorable.

That is, in the present invention, it is preferable that the sum of the thickness of the curable resin layer 12 and the first pressure-sensitive adhesive layer 13 be in the above-described range and the thickness of the curable resin layer 12 be in the above-described range.

In the present specification, "the height of the bump" refers to the height from the circuit surface of the semiconductor wafer to the highest portion of the bump, and, in a case in which there is a plurality of bumps, the height of the bump refers to the average value of the heights of any five bumps. The height of the bump can be measured by observing a cross section obtained by cutting the semiconductor wafer along a flat surface perpendicular to the circuit surface using a microscope. "The thickness of the curable resin layer 12", "the thickness of the first pressure-sensitive adhesive layer 13", "the central pitch between bumps", and "the diameter of the bump" are respectively represented by the average value of values at any five places. "The thickness of the curable resin layer 12" and "the thickness of the first pressure-sensitive adhesive layer 13" can be measured by observing a cross section obtained by placing the first protective film-forming sheet on any flat surface and cutting the first protective film-forming sheet along a flat sheet perpendicular to the above-described flat surface using a microscope. "The central pitch between bumps" and "the diameter of the bump" can be measured by observing the semiconductor wafer having the bumps using a microscope in the normal direction to the circuit surface. As the microscope, it is possible to use, for example, VHX-5000 (manufactured by Keyence Corporation).

In the present invention, the curable resin layer 12 preferably has a characteristic of a wetting and spreading property at a temperature of 70° C. under a load of 400 gf for a retention time of five seconds being 110% to 300%, more preferably 120% to 250%, still more preferably 150% to 200%, and particularly preferably 150% to 180%. Here, "the wetting and spreading property" refers to an index that indicates the hardness of the curable resin layer 12 under predetermined conditions, and, when the wetting and spreading property is in the above-described range, during the lamination of the circuit surface and the bumps of the semiconductor wafer by attaching the curable resin layer 12 of the first protective film-forming sheet 1 to the bump-provided surface of the semiconductor wafer and heating the curable resin layer, the curable resin layer 12 spreads among the bumps so as to cover the bumps and adheres to the circuit surface, and thus the generation of gaps in the first protective film can be suppressed, and the bump apex exposure characteristic of the bumps is favorable. "The wetting and spreading property" in the present specification can be measured using a method described below.

In addition, in the present invention, the curable resin layer 12 preferably includes a filler described below.

Furthermore, in the present invention, the first pressure-sensitive adhesive layer 13 preferably has a characteristic of a shear elastic modulus being $1.0 \times 10^3$ Pa to $1.0 \times 10^8$ Pa, more preferably $5.0 \times 10^3$ Pa to $1.0 \times 10^7$ Pa, still more preferably $1.0 \times 10^4$ Pa to $5.0 \times 10^6$ Pa, and particularly preferably $1.0 \times 10^6$ Pa to $5.0 \times 10^6$ Pa. Here, "the shear elastic modulus" refers to an index that indicates the degree of stress with respect to strain in the first pressure-sensitive adhesive layer 13, and, when the shear elastic modulus of the first pressure-sensitive adhesive layer 13 is too high or too low, the gap suppression property and the bump apex exposure characteristic of the curable resin layer 12, particularly, the bump apex exposure characteristic is adversely affected. That is, when the shear elastic modulus of the first pressure-sensitive adhesive layer 13 is in the above-described range, during the lamination of the circuit surface and the bumps of the semiconductor wafer by attaching the curable resin layer 12 of the first protective film-forming sheet 1 to the bump-provided surface of the semiconductor wafer and heating the curable resin layer, the curable resin layer 12 spreads among the bumps so as to cover the bumps and adheres to the circuit surface, and thus the generation of gaps in the first protective film can be suppressed, and the bump apex exposure characteristic of the bumps is favorable. "The shear elastic modulus" in the present specification can be measured using a method described below.

Figure 2:
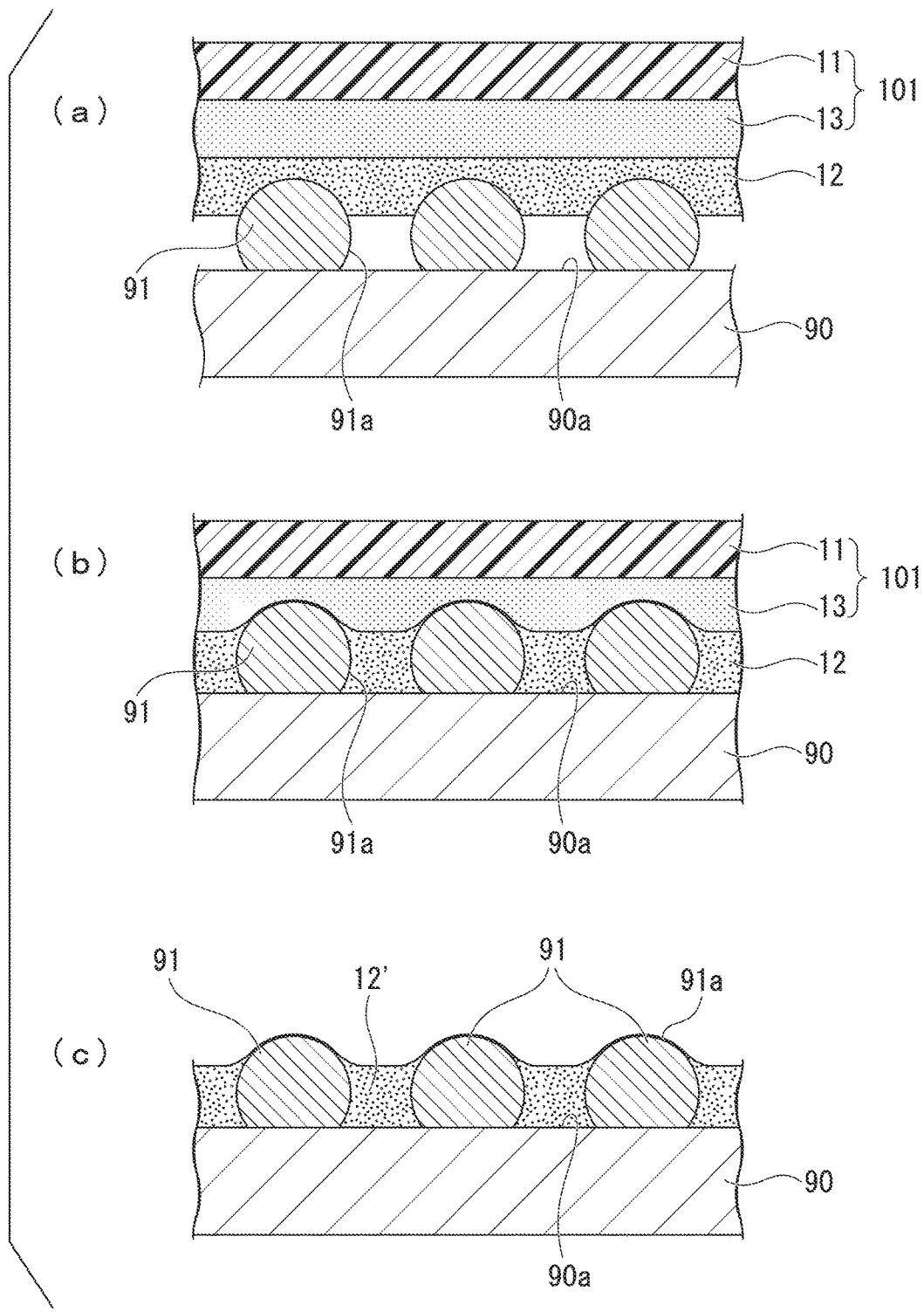
FIG. 2 is a step view of a method for forming a first protective film that protects a circuit surface of a semiconductor wafer having bumps formed on the circuit surface and the bumps using the first protective film-forming sheet of the present invention.

FIG. 2 is a step view of a method for forming the first protective film that protects the circuit surface of the semiconductor wafer having the bumps formed on the circuit surface and the bumps using the first protective film-forming sheet of the present invention. Meanwhile, in FIG. 2, the same constituent elements as in FIG. 1 are given the same reference signs as in FIG. 1 and will not be described in detail. What has been described above is also true for FIGS. 3 and 4.

As illustrated in FIG. 2(a), the first protective film-forming sheet of the present invention is used in a state of being attached to the bump-provided surface (bump-formed surface) of the semiconductor wafer through the curable resin layer (curable resin film). In addition, as illustrated in FIG. 2(b), the attached curable resin layer becomes more fluid by heating, spreads among the bumps so as to cover the bumps, adheres to the circuit surface, and cover the surfaces of the bumps, particularly, the surfaces of the portions close to the circuit surface, thereby burying the bumps. The curable resin layer in this state is further cured by heating or irradiation with energy rays and forms the first protective film in the end, thereby protecting the bumps in a state of adhering to the surfaces of the bumps on the circuit surface.

In the semiconductor wafer to which the first protective film-forming sheet has been attached, for example, the surface opposite to the circuit surface is ground, then, as illustrated in FIG. 2(c), the first supporting sheet is removed, and the bumps are buried and the first protective film is formed by curing the curable resin layer. In addition, finally, the semiconductor wafer is combined into a semiconductor chip in a state of including this first protective film.

When the curable resin film of the present invention is used, the circuit surface and the portions of the bumps close to the circuit surface, that is, the base portions of the bumps are sufficiently protected with the first protective film.

Figure 3:
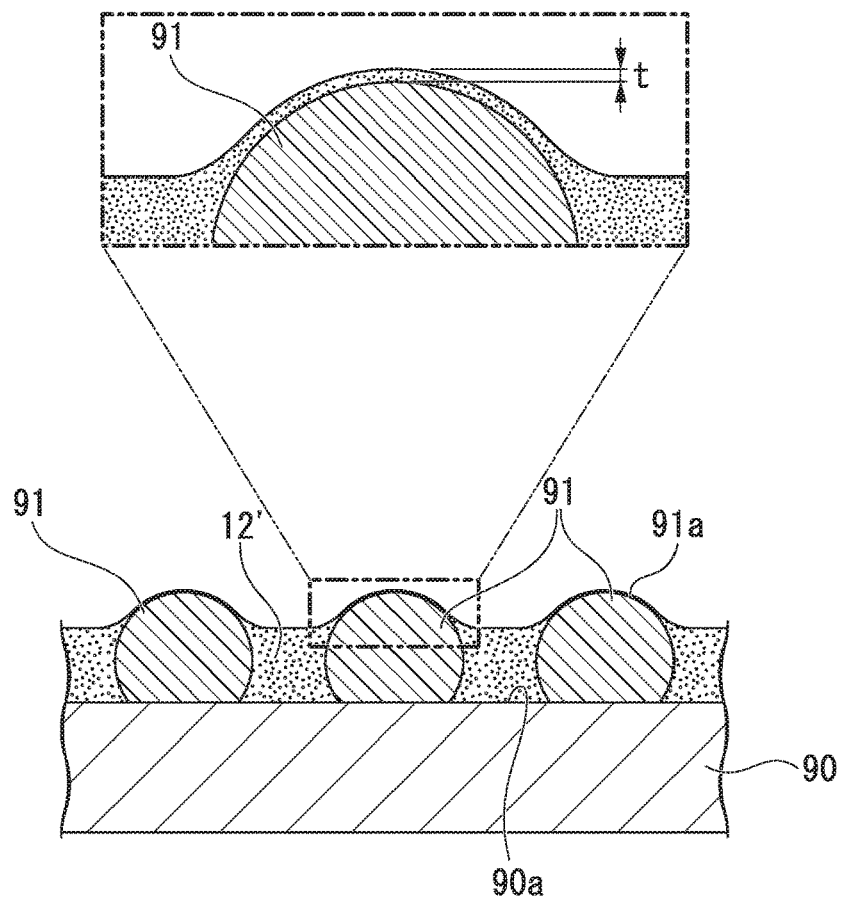
FIG. 3 is a cross-sectional view schematically illustrating an example of the semiconductor wafer including the first protective film formed using the first protective film-forming sheet of the present invention.

FIG. 3 is a cross-sectional view schematically illustrating an example of the semiconductor wafer including the first protective film formed using the first protective film-forming sheet of the present invention.

A plurality of bumps 91 is provided on a circuit surface 90a of a semiconductor wafer 90 illustrated in the drawing. The bump 91 has a shape of a sphere a part of which is cut out along a flat surface, and a flat surface corresponding to a portion exposed by cutting out the above-described part comes into contact with the circuit surface 90a of the semiconductor wafer 90.

A first protective film 12' is a film formed from the curable resin layer of the first protective film-forming sheet 1 of the present invention, coats the circuit surface 90a of the semiconductor wafer 90, and further coats the surfaces 91a other than the apexes and portions close to the apexes among the bumps 91. As described above, the first protective film 12' adheres to, among the surfaces 91a of the bumps 91, the regions other than the apexes of the bumps 91 and the portions close to the apexes and also adheres to the circuit surface 90a of the semiconductor wafer 90, thereby burying the bumps 91.

In the present invention, even in a case in which the apexes and the portions close to the apexes are coated with the first protective film 12' at a thickness t of the first protective film on the apex portions of the bumps, if the coating is broken on the apex portions and the apex portions become electrically conductive when the first protective film is heated by the reflow of solder or the like and such a semiconductor chip and an adherend (not illustrated) are bonded to each other, such a first protective film-forming sheet is in the scope of the present invention. Here, the thickness t of the first protective film on the apex portion needs to be 5 μm or less and is more preferably 0 μm, that is, it is preferable that the apex portion of the bump penetrates the first protective film 12' and be exposed.

It is preferable that between the surfaces 91a of the bumps 91 and the circuit surface 90a of the semiconductor wafer 90, that is, the bump-formed surface and the first protective film 12', no gap be present, and also no gap be present in the first protective film 12'. The above-described almost spherical shape of the bump 91 is particularly advantageous in terms of the formation of the first protective film in which the generation of gaps is suppressed.

In addition, the diameter of the bump 91 in a direction parallel to the circuit surface 90a increases as the height of the bump 91 from the lowest portion (in other words, a portion in contact with the circuit surface 90a) increases and, once being maximized, conversely decreases. That is, a space sandwiched by the surface 91a in the base portion (a portion close to the circuit surface 90a) of the bump 91 and the circuit surface 90a becomes particularly narrow even among spaces on the bump-formed surface and becomes narrower as the height comes close to the lowest portion of the bump 91. In the above-described spaces, it is difficult to fill the spaces with the first protective film or remove air bubbles in the first protective film, and thus, particularly, the air bubbles or gaps are likely to remain.

However, when a thermosetting resin film of the present invention is used, even in the above-described narrow space, it is possible to form the first protective film 12' in which the generation of gaps is sufficiently suppressed. Therefore, the above-described almost spherical shape of the bump 91 is particularly advantageous since the protection action of the first protective film 12' in the base portion of the bump 91 can be sufficiently obtained.

Meanwhile, the semiconductor wafer which is an application target of the first protective film-forming sheet of the present invention is not limited to the semiconductor wafer illustrated in FIG. 3, and a part of the constitution may be modified, deleted, or added as long as the effects of the present invention are not impaired. For example, in FIG. 3, bumps having the above-described almost spherical shape (a shape of a sphere a part of which is cut out along a flat surface) are illustrated as the bumps, but bumps having a shape formed by stretching the above-described almost spherical shape in a height direction (a direction intersecting the circuit surface 90a of the semiconductor wafer 90 in FIG. 3), that is, a shape of a spheroid which is almost a prolate sphere (a shape obtained by cutting off a portion including one end of a spheroid which is a prolate sphere in a long axis direction along a flat surface) or bumps having a shape formed by pressing the above-described almost spherical shape in the height direction, that is, a shape of a spheroid which is almost an oblate sphere (a shape obtained by cutting off a portion including one end of a spheroid which is an oblate sphere in a short axis direction along a flat surface) can also be exemplified as bumps having a preferred shape. The above-described almost spheroidal bumps are also, similar to the above-described almost spherical bumps, particularly advantageous in terms of the formation of the first protective film in which the generation of gaps is suppressed.

Figure 4:
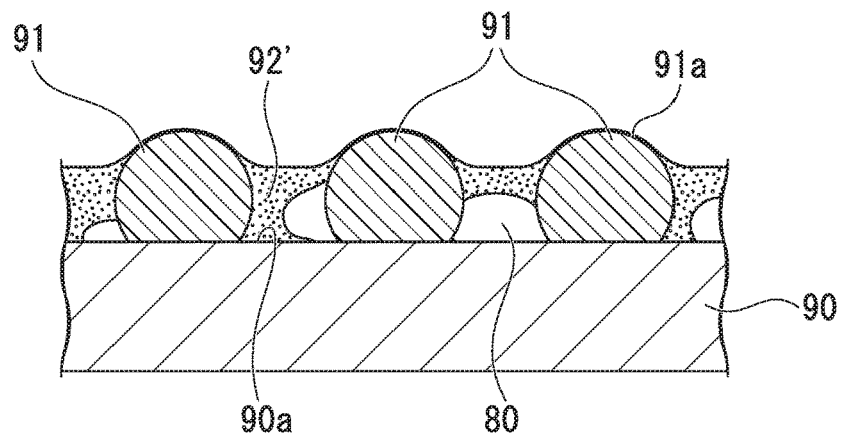
FIG. 4 is a cross-sectional view schematically illustrating an example of the semiconductor wafer including a protective film formed using a protective film-forming sheet of the related art.

On the other hand, FIG. 4 is a cross-sectional view schematically illustrating an example of a state in which the first protective film is formed on the bump-formed surface using a protective film-forming sheet of the related art. Meanwhile, in FIG. 4, the same constituent elements as in FIG. 3 are given the same reference signs as in FIG. 3 and will not be described in detail.

A protective film 92' illustrated in the drawing is a protective film formed using a curable resin film of a protective film-forming sheet of the related art. In the protective film 92', gaps 80 are present, and furthermore, gaps 80 are also present between the surfaces 91a of the bumps 91 or the circuit surface 90a of the semiconductor wafer 90, that is, the bump-formed surface and the first protective film 12'. Particularly, air bubbles 8 are likely to remain between the surfaces 91a in the base portions of the bumps 91 and the first protective film 12'. In addition, gaps 80 are likely to be generated in the protective film 92' in portions sandwiched by the surfaces 91a in the base portions of the bumps 91 and the circuit surface 90a.

In a case in which the curable resin layer is thermally curable, it is preferable that the thermosetting resin film before being cured be attached to the bump-formed surface of the semiconductor wafer and then thermally cured while being pressurized, and it is more preferable that the thermosetting resin film before being cured be heated so as to become more fluid (that is, soften) and bury the bumps and, furthermore, be pressurized when being thermally cured by heating so as to form the first protective film. As described above, when the thermosetting resin film is pressurized while being cured by heating, an effect of suppressing the generation of gaps in the first protective film becomes more favorable.

The pressure applied during the softening and curing of the thermosetting resin film by heating may be appropriately adjusted and is preferably 0.1 Pa or higher, more preferably 0.1 to 1 MPa, still more preferably 0.2 to 0.8 MPa, and particularly preferably 0.4 to 0.6 MPa. When the pressure is equal to or higher than the above-described lower limit value, the effect of suppressing the generation of gaps in the first protective film becomes more favorable, and, when the pressure is equal to or lower than the above-described upper limit value, an effect of suppressing the breakage of the circuit surface of the semiconductor wafer is enhanced.

The thermosetting resin film is preferably pressurized in a pressurized atmosphere during the softening and curing by heating. In such a case, the thermosetting resin film can be easily pressurized.

The heating temperature during the softening and curing of the thermosetting resin film by heating may be appropriately adjusted depending on the type and the like of the thermosetting resin film and is preferably 60° C. to 200° C.

In a case in which the curable resin layer is energy ray-curable, the first protective film can be formed by, for example, curing the curable resin layer with UV irradiation at 230 mW/cm$^2$ and 380 mJ/cm$^2$.

Generally, a long time is taken to heat and cure protective film-forming sheets including a thermosetting resin film of the related art (for example, one hour at 160° C. to two hours at 130° C.), and thus there is a demand for shortening the curing time. When it is possible to use protective film-forming sheets including a UV-curable resin film instead of protective film-forming sheets including a thermosetting resin film of the related art, the heating time can be shortened.

⊗ First Base Material

The first base material is a sheet-form or film-form base material, and examples of a constituent material thereof include a variety of resins.

Examples of the resins include polyethylene such as low-density polyethylene (LDPE), linear low-density polyethylene (LLDPE), and high-density polyethylene (HDPE); polyolefin other than polyethylene such as polypropylene, polybutene, polybutadiene, polymethylpentene, and norbornene resins; ethylene-based copolymers (copolymers obtained using ethylene as monomers) such as ethylene-vinyl acetate copolymers, ethylene-(meth)acrylic acid copolymers, ethylene-(meth)acrylic acid ester copolymers, and ethylene-norbornene copolymers; vinyl chloride-based resins (resins obtained using vinyl chloride as monomers) such as polyvinyl chloride and vinyl chloride copolymers; polystyrene; polycycloolefin; polyesters such as polyethylene terephthalate, polyethylene naphthalate, polybutylene terephthalate, polyethylene isophthalate, polyethylene-2,6-naphthalene dicarboxylate, and wholly aromatic polyesters in which all constituent units have an aromatic cyclic group; copolymers of two or more polyester described above; poly(meth)acrylic acid esters; polyurethane; polyurethane acrylate; polyimide; polyamide; polycarbonate; fluororesin; polyacetal; modified polyphenylene oxides; polyphenylene sulfides; polysulfone; polyether ketones; and the like.

In addition, examples of the resins also include polymer alloys such as mixtures of the polyester and other resin. The polymer alloys of the polyester and other resin are preferably polymer alloys in which the amount of the resin other than the polyester is relatively small.

In addition, examples of the resins also include crosslinked resins in which one or two or more resins exemplified above are crosslinked with each other; modified resins such as ionomers for which one or two or more resins exemplified above are used; and the like.

Meanwhile, in the present specification, "(meth)acrylic acid" refers to both "acrylic acid" and "methacrylic acid". What has been described above is also true for terminologies similar to (meth)acrylic acid, for example, "(meth)acrylate" refers to both "acrylate" and "methacrylate", and "a (meth)acryloyl group" refers to both "an acryloyl group" and "a methacryloyl group".

One or more types of resins may constitute the first base material, and, in a case in which two or more types of resins constitute the first base material, the combination and ratio thereof can be arbitrarily selected.

The first base material may be a single layer (monolayer) or a plurality of layers (two or more layers), and, in a case in which the first base material is a plurality of layers, the respective layers in the plurality of layers may be identical to or different from one another, and the combination of the plurality of layers is not particularly limited.

The thickness of the first base material is preferably 5 to 1,000 µm, more preferably 10 to 500 µm, still more preferably 15 to 300 µm, and particularly preferably 20 to 150 µm.

Here, "the thickness of the first base material" refers to the thickness of the entire first base material, and, for example, the thickness of the first base material made up of a plurality of layers refers to the total thickness of all of the layers constituting the first base material.

The first base material is preferably a first base material having a high accuracy in thickness, that is, a first base material in which the variation of the thickness is suppressed throughout the entire portion. Among the above-described constituent materials, examples of materials that can be used to constitute the above-described first base material having a high accuracy in thickness include polyethylene, polyolefin other than polyethylene, polyethylene terephthalate, ethylene-vinyl acetate copolymers, and the like.

The first base material may also contain, in addition to the main constituent material such as the resin, a variety of well-known additives such as a filler, a colorant, an antistatic agent, an antioxidant, an organic lubricant, a catalyst, and a softening agent (plasticizer).

The first base material may be transparent or opaque and may be colored depending on the purpose. In addition, other layers may be deposited on the first base material.

In a case in which the first pressure-sensitive adhesive layer described below or the curable resin layer is energy ray-curable, the first base material preferably transmits energy rays.

The first base material can be manufactured using a well-known method. For example, the first base material containing the resin can be manufactured by forming a resin composition containing the resin.

—First Pressure-Sensitive Adhesive Layer

The first pressure-sensitive adhesive layer has a sheet form or a film form and contains a pressure-sensitive adhesive.

Examples of the pressure-sensitive adhesive include pressure-sensitive adhesive resins such as acrylic resins (pressure-sensitive adhesives made of a resin having a (meth) acryloyl group), urethane-based resins (pressure-sensitive adhesives made of a resin having a urethane bond), rubber-based resins (pressure-sensitive adhesives made of a resin having a rubber structure), silicone-based resins (pressure-sensitive adhesives made of a resin having a siloxane bond), epoxy-based resins (pressure-sensitive adhesives made of a resin having an epoxy group), polyvinyl ethers, and polycarbonate, and acrylic resins are preferred.

Meanwhile, in the present invention, "pressure-sensitive adhesive resins" refer to both resins having a pressure-sensitive adhesive property and resins having an adhesive property, and examples thereof include not only resins having an adhesive property for themselves but also resins exhibiting a pressure-sensitive adhesive property when jointly used with other components such as additives, resins exhibiting an adhesive property due to the presence of a trigger such as heat or water, and the like.

The first pressure-sensitive adhesive layer may be a single layer (monolayer) or a plurality of layers of two or more layers, and, in a case in which the first pressure-sensitive adhesive layer is a plurality of layers, the respective layers in the plurality of layers may be identical to or different from one another, and the combination of the plurality of layers is not particularly limited.

The thickness of the first pressure-sensitive adhesive layer is preferably 10 to 180 µm, more preferably 60 to 150 µm, and particularly preferably 60 to 90 µm. Here, the sum of the thickness of the curable resin layer and the thickness of the first pressure-sensitive adhesive layer is preferably 110 µm or more, more preferably 110 to 200 µm, still more preferably 110 to 170 µm, and particularly preferably 110 to 140 µm.

Here, "the thickness of the first pressure-sensitive adhesive layer" refers to the thickness of the entire first pressure-sensitive adhesive layer, and, for example, the thickness of the first pressure-sensitive adhesive layer made up of a plurality of layers refers to the total thickness of all of the layers constituting the first pressure-sensitive adhesive layer.

The first pressure-sensitive adhesive layer may be a first pressure-sensitive adhesive layer formed using an energy ray-curable pressure-sensitive adhesive or a first pressure-sensitive adhesive layer formed using a non-energy ray-curable pressure-sensitive adhesive. For the first pressure-sensitive adhesive layer formed using an energy ray-curable pressure-sensitive adhesive, it is possible to easily adjust the properties before curing and after curing.

In the present invention, "energy rays" refer to rays having energy quanta in electromagnetic waves or charged particle radiation, and examples thereof include ultraviolet rays, electron beams, and the like.

Ultraviolet rays can be radiated using, for example, a high-pressure mercury lamp, a fusion H lamp, a xenon lamp, or the like as an ultraviolet ray source. As the electron beams, electron beams generated using an electron beam accelerator or the like can be radiated.

In the present invention, "being energy ray-curable" refers to a property of being cured by irradiation with energy rays, and "being non-energy ray-curable" refers to a property of not being cured by irradiation with energy rays.

<<First Pressure-Sensitive Adhesive Composition>>

The first pressure-sensitive adhesive layer can be formed using a first pressure-sensitive adhesive composition containing a pressure-sensitive adhesive. For example, the first pressure-sensitive adhesive layer can be formed at an intended portion by applying the first pressure-sensitive adhesive composition to a target surface on which the first pressure-sensitive adhesive layer is to be formed and drying the first pressure-sensitive adhesive composition as necessary. A more specific method for forming the first pressure-sensitive adhesive layer will be described below in detail together with methods for forming other layers. The ratio between the contents of components which do not gasify at normal temperature in the first pressure-sensitive adhesive composition is, generally, identical to the ratio between the contents of the above-described components in the first pressure-sensitive adhesive layer. Meanwhile, in the present specification, "normal temperature" refers to a temperature that is not particularly cooled or heated, that is, a temperature in an ordinary state, and examples thereof include a temperature of 15° C. to 25° C. and the like.

The first pressure-sensitive adhesive composition may be applied using a well-known method, and examples thereof include methods in which a variety of coaters such as an air knife coater, a blade coater, a bar coater, a gravure coater, a roll coater, a roll knife coater, a curtain coater, a die coater, a knife coater, a screen coater, a Mayer bar coater, and a kiss coater are used.

The drying conditions of the first pressure-sensitive adhesive composition are not particularly limited; however, in a case in which the first pressure-sensitive adhesive composition contains a solvent described below, the first pressure-sensitive adhesive composition is preferably heated and dried, and, in this case, the first pressure-sensitive adhesive composition is preferably dried under conditions of, for example, 70° C. to 130° C. and 10 seconds to five minutes.

In a case in which the first pressure-sensitive adhesive layer is energy ray-curable, examples of the first pressure-sensitive adhesive composition containing an energy ray-curable pressure-sensitive adhesive, that is, an energy ray-curable first pressure-sensitive adhesive composition include a first pressure-sensitive adhesive composition (I-1) containing a non-energy ray-curable pressure-sensitive adhesive resin (I-1a) (hereinafter, in some cases, abbreviated as "the pressure-sensitive adhesive resin (I-1a)") and an energy ray-curable compound; a first pressure-sensitive adhesive composition (I-2) containing an energy ray-curable pressure-sensitive adhesive resin (I-2a) in which an unsaturated group is introduced into a side chain of the non-energy ray-curable pressure-sensitive adhesive resin (I-1a) (hereinafter, in some cases, abbreviated as "the pressure-sensitive adhesive resin (I-2a)"); a first pressure-sensitive adhesive composition (I-3) containing the pressure-sensitive adhesive resin (I-2a) and an energy ray-curable low-molecular-weight compound; and the like.

<First Pressure-Sensitive Adhesive Composition (I-1)>

As described above, the first pressure-sensitive adhesive composition (I-1) contains the non-energy ray-curable pressure-sensitive adhesive resin (I-1a) and an energy ray-curable compound.

[Pressure-Sensitive Adhesive Resin (I-1a)]

The pressure-sensitive adhesive resin (I-1a) is preferably an acrylic resin.

Examples of the acrylic resin include acrylic polymers having at least a constituent unit derived from an alkyl (meth)acrylate.

The acrylic resin may have one or more types of constituent units, and, in a case in which the acrylic resin has two or more types of constituent units, the combination and ratio thereof can be arbitrarily selected.

Examples of the alkyl (meth)acrylate include alkyl (meth)acrylates in which the number of carbon atoms in an alkyl group constituting the alkyl ester is 1 to 20, and the alkyl group is preferably a linear alkyl group or a branched alkyl group.

More specific examples of the alkyl (meth)acrylate include methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, tert-butyl (meth)acrylate, pentyl (meth)acrylate, hexyl (meth)acrylate, heptyl (meth)acrylate, 2-ethylhexyl (meth)acrylate, isooctyl (meth)acrylate, n-octyl (meth)acrylate, n-nonyl (meth)acrylate, isononyl (meth)acrylate, decyl (meth)acrylate, undecyl (meth)acrylate, dodecyl (meth)acrylate (also referred to as lauryl (meth)acrylate), tridecyl (meth)acrylate, tetradecyl (meth)acrylate (also referred to as myristyl (meth)acrylate), pentadecyl (meth)acrylate, hexadecyl (meth)acrylate (also referred to as palmityl (meth)acrylate), heptadecyl (meth)acrylate, octadecyl (meth)acrylate (also referred to as stearyl (meth)acrylate), nonadecyl (meth)acrylate, icosyl (meth)acrylate, and the like.

Since the pressure-sensitive adhesive force of the first pressure-sensitive adhesive layer improves, the acrylic polymer preferably has a constituent unit derived from an alkyl (meth)acrylate in which the number of carbon atoms in the alkyl group is four or more. In addition, since the pressure-sensitive adhesive force of the first pressure-sensitive adhesive layer further improves, the number of carbon atoms in the alkyl group is preferably 4 to 12 and more preferably 4 to 8. In addition, the alkyl (meth)acrylate in which the number of carbon atoms in the alkyl group is four is preferably alkyl acrylate.

The acrylic polymer preferably further has, in addition to the constituent unit derived from the alkyl (meth)acrylate, a constituent unit derived from a functional group-containing monomer.

Examples of the functional group-containing monomer include monomers in which the functional group reacts with a crosslinking agent described below and thus serves as a starting point of crosslinking or the functional group reacts with an unsaturated group in an unsaturated group-containing compound and thus enables the introduction of the unsaturated group into a side chain of the acrylic polymer.

Examples of the functional group in the functional group-containing monomer include a hydroxyl group, a carboxy group, an amino group, an epoxy group, and the like.

That is, examples of the functional group-containing monomer include hydroxyl group-containing monomers, carboxy group-containing monomers, amino group-containing monomers, epoxy group-containing monomers, and the like.

Examples of the hydroxyl group-containing monomers include hydroxyalkyl (meth)acrylates such as hydroxymethyl (meth)acrylate, 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, and 4-hydroxybutyl (meth)acrylate; non-(meth)acrylic unsaturated alcohols such as vinyl alcohol and allyl alcohol (unsaturated alcohols not having a (meth)acryloyl skeleton); and the like.

Examples of the carboxy group-containing monomers include ethylenic unsaturated monocarboxylic acids such as (meth)acrylic acid and crotonic acid (monocarboxylic acids having an ethylenic unsaturated bond); ethylenic unsaturated dicarboxylic acids such as fumaric acid, itaconic acid, maleic acid, and citraconic acid (dicarboxylic acids having an ethylenic unsaturated bond); anhydrides of the ethylenic unsaturated dicarboxylic acid; carboxyalkyl (meth)acrylates such as 2-carboxyethyl methacrylate; and the like.

The functional group-containing monomer is preferably the hydroxyl group-containing monomer or the carboxy group-containing monomer and more preferably the hydroxyl group-containing monomer.

The acrylic polymer may be constituted of one or two or more types of the functional group-containing monomers, and, in a case in which the acrylic polymer is constituted of two or more types of the functional group-containing monomers, the combination and ratio thereof can be arbitrarily selected.

In the acrylic polymer, the content of the constituent unit derived from the functional group-containing monomer is preferably 1% to 35% by mass, more preferably 3% to 32% by mass, and particularly preferably 5% to 30% by mass of the total mass of the constituent units.

The acrylic polymer may further have, in addition to the constituent unit derived from the alkyl (meth)acrylate and the constituent unit derived from the functional group-containing monomer, a constituent unit derived from a different monomer.

The different monomer is not particularly limited as long as the monomer can be copolymerized with the alkyl (meth)acrylate or the like.

Examples of the different monomer include styrene, α-methylstyrene, vinyl toluene, vinyl formate, vinyl acetate, acrylonitrile, acrylamide, and the like.

The acrylic polymer may be constituted of one or two or more types of the different monomers, and, in a case in which the acrylic polymer is constituted of two or more types of the different monomers, the connection and ratio thereof can be arbitrarily selected.

The acrylic polymer can be used as the non-energy ray-curable pressure-sensitive adhesive resin (I-1a).

Meanwhile, a substance obtained by causing an unsaturated group-containing compound having an energy ray-polymerizable unsaturated group (energy ray-polymerizable group) to react with the functional group in the acrylic polymer can be used as the energy ray-curable pressure-sensitive adhesive resin (I-2a).

Meanwhile, in the present invention, "being energy ray-polymerizable" refers to a property of being polymerized by irradiation with energy rays.

The first pressure-sensitive adhesive composition (I-1) may contain one or two or more types of the pressure-sensitive adhesive resins (I-1a), and, in a case in which the first pressure-sensitive adhesive composition contains two or more types of the pressure-sensitive adhesive resins, the combination and ratio thereof can be arbitrarily selected.

In the first pressure-sensitive adhesive composition (I-1), the content of the pressure-sensitive adhesive resin (I-1a) is preferably 5% to 99% by mass, more preferably 10% to 95% by mass, and particularly preferably 15% to 90% by mass of the total mass of the first pressure-sensitive adhesive composition (I-1).

[Energy Ray-Curable Compound]

Examples of the energy ray-curable compound contained in the first pressure-sensitive adhesive composition (I-1) include monomers or oligomers which have an energy ray-polymerizable unsaturated group and can be cured by irradiation with energy rays.

Among the energy ray-curable compounds, examples of monomers include polyhydric (meth)acrylates such as trimethylolpropane tri(meth)acrylate, pentaerythritol (meth)acrylate, pentaerythritol tetra(meth)acrylate, dipentaerythritol hexa(meth)acrylate, 1,4-butylene glycol di(meth)acrylate, and 1,6-hexanediol (meth)acrylate; urethane (meth)acrylate; polyether (meth)acrylate; polyether (meth)acrylate; epoxy (meth)acrylate; and the like.

Among the energy ray-curable compounds, examples of oligomers include oligomers obtained by polymerizing the monomers exemplified above.

The energy ray-curable compound is preferably urethane (meth)acrylate or a urethane (meth)acrylate oligomer since the molecular weight is relatively great and the storage elastic modulus of the first pressure-sensitive adhesive layer is not easily decreased.

The first pressure-sensitive adhesive composition (I-1) may contain one or two or more types of the energy ray-curable compounds, and, in a case in which the first pressure-sensitive adhesive composition contains two or more types of the energy ray-curable compounds, the combination and ratio thereof can be arbitrarily selected.

In the first pressure-sensitive adhesive composition (I-1), the content of the energy ray-curable compound is preferably 1% to 95% by mass, more preferably 5% to 90% by mass, and particularly preferably 10% to 85% by mass of the total mass of the first pressure-sensitive adhesive composition (I-1).

[Crosslinking Agent]

In a case in which the acrylic polymer further having, in addition to the constituent unit derived from the alkyl (meth)acrylate, the constituent unit derived from the functional group-containing monomer as the pressure-sensitive adhesive resin (I-1a), the first pressure-sensitive adhesive composition (I-1) preferably further contains a crosslinking agent.

The crosslinking agent is, for example, a substance that reacts with the functional group and thus crosslinks the pressure-sensitive adhesive resins (I-1a).

Examples of the crosslinking agent include isocyanate-based crosslinking agents (crosslinking agents having an isocyanate group) such as tolylene diisocyanate, hexamethylene diisocyanate, xylene diisocyanate, and adducts of the above-described diisocyanate; epoxy-based crosslinking agents (crosslinking agents having a glycidyl group) such as ethylene glycol glycidyl ether; aziridine-based crosslinking agents (crosslinking agents having an aziridine group) such as hexa[1-(2-methyl)-aziridinyl]triphosphatriazine; metal chelate-based crosslinking agents (crosslinking agents having a metal chelate structure) such as aluminum chelates; isocyanurate-based crosslinking agents (crosslinking agents having an isocyanuric acid skeleton); and the like.

The crosslinking agent is preferably the isocyanate-based crosslinking agent since the isocyanate-based crosslinking agent improves the cohesive force of the pressure-sensitive adhesive so as to improve the pressure-sensitive adhesive force of the first pressure-sensitive adhesive layer, is easily procurable, and the like.

The first pressure-sensitive adhesive composition (I-1) may contain one or two or more types of the crosslinking agents, and, in a case in which the first pressure-sensitive adhesive composition contains two or more types of the crosslinking agents, the combination and ratio thereof can be arbitrarily selected.

In the first pressure-sensitive adhesive composition (I-1), the content of the crosslinking agent is preferably 0.01 to 50 parts by mass, more preferably 0.1 to 20 parts by mass, and particularly preferably 1 to 10 parts by mass of the content (100 parts by mass) of the pressure-sensitive adhesive resin (I-1a).

[Photopolymerization Initiator]

The first pressure-sensitive adhesive composition (I-1) may also further contain a photopolymerization initiator. The first pressure-sensitive adhesive composition (I-1) containing the photopolymerization initiator sufficiently proceeds with a curing reaction even when irradiated with energy rays having a relatively low energy such as ultraviolet rays.

Examples of the photopolymerization initiator include benzoin compounds such as benzoin, benzoin methyl ether, benzoin ethyl ether, benzoin isopropyl ether, benzoin isobutyl ether, benzoin benzoate, methyl benzoin benzoate, and benzoin dimethyl ketal; acetophenone compounds such as acetophenone, 2-hydroxy-2-methyl-1-phenyl-propane-1-one, and 2,2-dimethoxy-1,2-diphenylethane-1-one; acylphosphine oxide compounds such as bis(2,4,6-trimethylbenzoyl)phenylphosphine oxide and 2,4,6-trimethylbenzoyldiphenylphosphine oxide; sulfide compounds such as benzylphenyl sulfide and tetramethylthiuram monosulfide; α-ketol compounds such as 1-hydroxycyclohexyl phenyl ketone; azo compounds such as azobisisobutyronitrile; titanocene compounds such as titanocene; thioxanthone compounds such as thioxanthone; peroxide compounds; diketone compounds such as diacetyle; benzyl, dibenzyl, benzophenone, 2,4-diethylthioxanthone, 1,2-diphenylmethane, 2-hydroxy-2-methyl-1-[4-(1-methylvinyl)phenyl]propanone, 2-chloroanthraquinone, and the like.

In addition, as the photopolymerization initiator, for example, a quinone compound such as 1-chloroanthraquinone; a photosensitizer such as amine; or the like can also be used.

The first pressure-sensitive adhesive composition (I-1) may contain one or two or more types of the photopolymerization initiators, and, in a case in which the first pressure-sensitive adhesive composition contains two or more types of the photopolymerization initiators, the combination and ratio thereof can be arbitrarily selected.

In the first pressure-sensitive adhesive composition (I-1), the content of the photopolymerization initiator is preferably 0.01 to 20 parts by mass, more preferably 0.03 to 10 parts by mass, and particularly preferably 0.05 to 5 parts by mass of the content (100 parts by mass) of the energy ray-curable compound.

[Other Additives]

The first pressure-sensitive adhesive composition (I-1) may also contain other additives which do not correspond to any of the above-described components as long as the effects of the present invention are not impaired.

Examples of the other additives include a variety of additives such as an antistatic agent, an antioxidant, a softening agent (plasticizer), a filler (filler), an antirust agent, a colorant (a pigment or a dye), a sensitizer, a tackifier, a reaction retardant, and a crosslinking accelerator (catalyst).

Meanwhile, the reaction retardant is a substance that suppresses the progress of an unintended crosslinking reaction in the first pressure-sensitive adhesive composition (I-1) under storage due to, for example, the action of the catalyst mixed into the first pressure-sensitive adhesive composition (I-1). Examples of the reaction retardant include reaction retardants that form a chelate complex due to a chelate with respect to the catalyst, and more specific examples thereof include substances having two or more carbonyl groups (—C(=O)—) in one molecule.

The first pressure-sensitive adhesive composition (I-1) may contain one or two or more types of the other additives, and, in a case in which the first pressure-sensitive adhesive composition contains two or more types of the other additives, the combination and ratio thereof can be arbitrarily selected.

In the first pressure-sensitive adhesive composition (I-1), the content of the other additives is not particularly limited and may be appropriately selected depending on the type of the additives.

[Solvent]

The first pressure-sensitive adhesive composition (I-1) may also contain a solvent. When the first pressure-sensitive adhesive composition (I-1) contains a solvent, the coating aptitude to a coating target surface improves.

The solvent is preferably an organic solvent, and examples of the organic solvent include ketones such as methyl ethyl ketone and acetone; esters (carboxylic acid esters) such as ethyl acetate; ethers such as tetrahydrofuran and dioxane; aliphatic hydrocarbons such as cyclohexane and n-hexane; aromatic hydrocarbons such as toluene and xylene; alcohols such as 1-propanol and 2-propanol; and the like.

As the solvent, a solvent used during the manufacturing of the pressure-sensitive adhesive resin (I-1a) may be continuously used in the first pressure-sensitive adhesive composition (I-1) without being removed from the pressure-sensitive adhesive resin (I-1a) or a solvent of the same type as or a different type from the solvent used during the manufacturing of the pressure-sensitive adhesive resin (I-1a) may be separately added during the manufacturing of the first pressure-sensitive adhesive composition (I-1).

The first pressure-sensitive adhesive composition (I-1) may contain one or two or more types of the solvents, and, in a case in which the first pressure-sensitive adhesive composition contains two or more types of the solvents, the combination and ratio thereof can be arbitrarily selected.

In the first pressure-sensitive adhesive composition (I-1), the content of the solvent is not particularly limited and may be appropriately adjusted.

<First Pressure-Sensitive Adhesive Composition (I-2)>

As described above, the first pressure-sensitive adhesive composition (1-2) contains an energy ray-curable pressure-sensitive adhesive resin (I-2a) in which an unsaturated group is introduced into a side chain of the non-energy ray-curable pressure-sensitive adhesive resin (I-1a).

[Pressure-Sensitive Adhesive Resin (I-2a)]

The pressure-sensitive adhesive resin (I-2a) can be obtained by, for example, causing an unsaturated group-containing compound having an energy ray-polymerizable unsaturated group to react with the functional group in the pressure-sensitive adhesive resin (I-1a).

The unsaturated group-containing compound is a compound further having, in addition to the energy ray-polymerizable unsaturated group, a group that can be bonded with the pressure-sensitive adhesive resin (I-1a) by reacting with the functional group in the pressure-sensitive adhesive resin (I-1a).

Examples of the energy ray-polymerizable unsaturated group include a (meth)acryloyl group, a vinyl group (ethenyl group), an allyl group (2-propenyl group), and the like, and a (meth)acryloyl group is preferred.

Examples of the group that can be bonded with the functional group in the pressure-sensitive adhesive resin (I-1a) include isocyanate groups and glycidyl groups that can be bonded with a hydroxyl group or an amino group, hydroxyl groups and amino groups that can be bonded with a carboxy group or an epoxy group, and the like.

Examples of the unsaturated group-containing compound include (meth)acryloyloxyethyl isocyanate, (meth)acryloyl isocyanate, glycidyl (meth)acrylate, and the like.

The first pressure-sensitive adhesive composition (I-2) may contain one or two or more types of the pressure-sensitive adhesive resins (I-2a), and, in a case in which the first pressure-sensitive adhesive composition contains two or more types of the pressure-sensitive adhesive compositions, the combination and ratio thereof can be arbitrarily selected.

In the first pressure-sensitive adhesive composition (I-2), the content of the pressure-sensitive adhesive resin (I-2a) is preferably 5% to 99% by mass, more preferably 10% to 95% by mass, and particularly preferably 10% to 90% by mass of the total mass of the first pressure-sensitive adhesive composition (I-2).

[Crosslinking Agent]

In a case in which, as the pressure-sensitive adhesive resin (I-2a), for example, the acrylic polymer having the constituent unit derived from the functional group-containing monomer, which is the same as that in the pressure-sensitive adhesive resin (I-1a) is used, the first pressure-sensitive adhesive composition (I-2) preferably further contains a crosslinking agent.

Examples of the crosslinking agent in the first pressure-sensitive adhesive composition (I-2) include the same crosslinking agents as those in the first pressure-sensitive adhesive composition (I-1).

The first pressure-sensitive adhesive composition (I-2) may contain one or two or more types of the crosslinking agents, and, in a case in which the first pressure-sensitive adhesive composition contains two or more types of the crosslinking agents, the combination and ratio thereof can be arbitrarily selected.

In the first pressure-sensitive adhesive composition (I-2), the content of the crosslinking agent is preferably 0.01 to 50 parts by mass, more preferably 0.1 to 20 parts by mass, and particularly preferably 1 to 10 parts by mass of the content (100 parts by mass) of the pressure-sensitive adhesive resin (I-2a).

[Photopolymerization Initiator]

The first pressure-sensitive adhesive composition (I-2) may also further contain a photopolymerization initiator. The first pressure-sensitive adhesive composition (1-2) containing the photopolymerization initiator sufficiently proceeds with a curing reaction even when irradiated with energy rays having a relatively low energy such as ultraviolet rays.

Examples of the photopolymerization initiator in the first pressure-sensitive adhesive composition (I-2) include the same photopolymerization initiators as those in the first pressure-sensitive adhesive composition (I-1).

The first pressure-sensitive adhesive composition (I-2) may contain one or two or more types of the photopolymerization initiators, and, in a case in which the first pressure-sensitive adhesive composition contains two or more types of the photopolymerization initiators, the combination and ratio thereof can be arbitrarily selected.

In the first pressure-sensitive adhesive composition (I-2), the content of the photopolymerization initiator is preferably 0.01 to 20 parts by mass, more preferably 0.03 to 10 parts by mass, and particularly preferably 0.05 to 5 parts by mass of the content (100 parts by mass) of the pressure-sensitive adhesive resin (I-2a).

[Other Additives]

The first pressure-sensitive adhesive composition (I-2) may also contain other additives which do not correspond to any of the above-described components as long as the effects of the present invention are not impaired.

Examples of the other additives in the first pressure-sensitive adhesive composition (I-2) include the same other additives as those in the first pressure-sensitive adhesive composition (I-1).

The first pressure-sensitive adhesive composition (I-2) may contain one or two or more types of the other additives, and, in a case in which the first pressure-sensitive adhesive composition contains two or more types of the other additives, the combination and ratio thereof can be arbitrarily selected.

In the first pressure-sensitive adhesive composition (I-2), the content of the other additives is not particularly limited and may be appropriately selected depending on the type of the additives.

[Solvent]

The first pressure-sensitive adhesive composition (I-2) may also contain a solvent for the same purpose as in the case of the first pressure-sensitive adhesive composition (I-1).

Examples of the solvent in the first pressure-sensitive adhesive composition (I-2) include the same solvents as those in the first pressure-sensitive adhesive composition (I-1).

The first pressure-sensitive adhesive composition (I-2) may contain one or two or more types of the solvents, and, in a case in which the first pressure-sensitive adhesive composition contains two or more types of the solvents, the combination and ratio thereof can be arbitrarily selected.

In the first pressure-sensitive adhesive composition (I-2), the content of the solvent is not particularly limited and may be appropriately adjusted.

<First Pressure-Sensitive Adhesive Composition (I-3)>

As described above, the first pressure-sensitive adhesive composition (1-3) contains the pressure-sensitive adhesive resin (I-2a) and an energy ray-curable low-molecular-weight compound.

In the first pressure-sensitive adhesive composition (I-3), the content of the pressure-sensitive adhesive resin (I-2a) is preferably 5% to 99% by mass, more preferably 10% to 95% by mass, and particularly preferably 15% to 90% by mass of the total mass of the first pressure-sensitive adhesive composition (I-3).

[Energy Ray-Curable Low-Molecular-Weight Compound]

Examples of the energy ray-curable low-molecular-weight compound contained in the first pressure-sensitive adhesive composition (I-3) include monomers or oligomers which have an energy ray-polymerizable unsaturated group and can be cured by irradiation with energy rays and include the same energy ray-curable compounds as that in the first pressure-sensitive adhesive composition (I-1).

The first pressure-sensitive adhesive composition (I-3) may contain one or two or more types of the energy ray-curable low-molecular-weight compounds, and, in a case in which the first pressure-sensitive adhesive composition contains two or more types of the energy ray-curable low-molecular-weight compounds, the combination and ratio thereof can be arbitrarily selected.

In the first pressure-sensitive adhesive composition (I-3), the content of the energy ray-curable low-molecular-weight compound is preferably 0.01 to 300 parts by mass, more preferably 0.03 to 200 parts by mass, and particularly preferably 0.05 to 100 parts by mass of the content (100 parts by mass) of the pressure-sensitive adhesive resin (I-2a).

[Photopolymerization Initiator]

The first pressure-sensitive adhesive composition (I-3) may also further contain a photopolymerization initiator. The first pressure-sensitive adhesive composition (1-3) containing the photopolymerization initiator sufficiently proceeds with a curing reaction even when irradiated with energy rays having a relatively low energy such as ultraviolet rays.

Examples of the photopolymerization initiator in the first pressure-sensitive adhesive composition (I-3) include the same photopolymerization initiators as those in the first pressure-sensitive adhesive composition (I-1).

The first pressure-sensitive adhesive composition (I-3) may contain one or two or more types of the photopolymerization initiators, and, in a case in which the first pressure-sensitive adhesive composition contains two or more types of the photopolymerization initiators, the combination and ratio thereof can be arbitrarily selected.

In the first pressure-sensitive adhesive composition (I-3), the content of the photopolymerization initiator is preferably 0.01 to 20 parts by mass, more preferably 0.03 to 10 parts by mass, and particularly preferably 0.05 to 5 parts by mass of the total content (100 parts by mass) of the pressure-sensitive adhesive resin (I-2a) and the energy ray-curable low-molecular-weight compound.

[Other Additives]

The first pressure-sensitive adhesive composition (I-3) may also contain other additives which do not correspond to any of the above-described components as long as the effects of the present invention are not impaired.

Examples of the other additives include the same other additives as those in the first pressure-sensitive adhesive composition (I-1).

The first pressure-sensitive adhesive composition (I-3) may contain one or two or more types of the other additives, and, in a case in which the first pressure-sensitive adhesive composition contains two or more types of the other additives, the combination and ratio thereof can be arbitrarily selected.

In the first pressure-sensitive adhesive composition (I-3), the content of the other additives is not particularly limited and may be appropriately selected depending on the type of the additives.

[Solvent]

The first pressure-sensitive adhesive composition (I-3) may also contain a solvent for the same purpose as in the case of the first pressure-sensitive adhesive composition (I-1).

Examples of the solvent in the first pressure-sensitive adhesive composition (I-3) include the same solvents as those in the first pressure-sensitive adhesive composition (I-1).

The first pressure-sensitive adhesive composition (I-3) may contain one or two or more types of the solvents, and, in a case in which the first pressure-sensitive adhesive composition contains two or more types of the solvents, the combination and ratio thereof can be arbitrarily selected.

In the first pressure-sensitive adhesive composition (I-3), the content of the solvent is not particularly limited and may be appropriately adjusted.

<First Pressure-Sensitive Adhesive Compositions Other than First Pressure-Sensitive Adhesive Compositions (I-1) to (I-3)>

Hitherto, the first pressure-sensitive adhesive composition (I-1), the first pressure-sensitive adhesive composition (I-2), and the first pressure-sensitive adhesive composition (I-3) have been mainly described, but the substances described as the contained components thereof can also be used in the same manner in general first pressure-sensitive adhesive compositions other than the above-described three types of first pressure-sensitive adhesive compositions (in the present specification, referred to as the first pressure-sensitive adhesive compositions other than the first pressure-sensitive adhesive compositions (I-1) to (I-3)).

Examples of the first pressure-sensitive adhesive compositions other than the first pressure-sensitive adhesive compositions (I-1) to (I-3) include, in addition to, the energy ray-curable pressure-sensitive adhesive compositions, non-energy ray-curable pressure-sensitive adhesive compositions.

Examples of the non-energy ray-curable pressure-sensitive adhesive compositions include non-energy ray-curable pressure-sensitive adhesive compositions containing a pressure-sensitive adhesive resin such as an acrylic resin (a resin having a (meth)acryloyl group), an urethane-based resin (a resin having a urethane bond), a rubber-based resin (a resin having a rubber structure), a silicone-based resin (a resin having a siloxane bond), an epoxy-based resin (a resin having an epoxy group), a polyvinyl ether, or a polycarbonate, and non-energy ray-curable pressure-sensitive adhesive compositions containing an acrylic resin are preferred.

The first pressure-sensitive adhesive compositions other than the first pressure-sensitive adhesive compositions (I-1) to (I-3) preferably contain one or two or more types of crosslinking agents, and the content thereof can be set to be the same as that in the case of the above-described first pressure-sensitive adhesive composition (I-1) or the like.

<<Method for Manufacturing First Pressure-Sensitive Adhesive Composition>>

The first pressure-sensitive adhesive compositions such as the first pressure-sensitive adhesive compositions (I-1) to (I-3) can be obtained by blending individual components for constituting the first pressure-sensitive adhesive compositions such as the pressure-sensitive adhesive, components other than the pressure-sensitive adhesive as necessary, and the like.

The addition order during the blending of the respective components is not particularly limited, and two or more types of components may be added at the same time.

In a case in which the solvent is used, the solvent may be used by mixing the solvent with all of the blending components other than the solvent so as to dilute these blending components in advance or may be used by mixing the solvent with the blending components without diluting all of the blending components other than the solvent in advance.

A method for mixing the respective components during blending is not particularly limited and may be appropriately selected from well-known methods such as a method in which the components are mixed together by rotating a stirring stick, a stirring blade, or the like; a method in which the components are mixed together using a mixer, and a method in which the components are mixed together by applying ultrasonic waves thereto.

The temperature and the time during the addition and mixing of the respective components are not particularly limited as long as the respective blending components do not deteriorate and may be appropriately adjusted, but the temperature is preferably 15° C. to 30° C.

—First Interlayer

The first interlayer has a sheet form or a film form, and a constituent material thereof may be appropriately selected depending on the purpose and is not particularly limited.

For example, in a case in which the purpose is to suppress the deformation of the protective film by reflecting the shape of bumps present on a semiconductor surface in the protective film that covers the semiconductor surface, examples of a preferred constituent material of the first interlayer include urethane (meth)acrylate and the like from the viewpoint of further improving the attachment property of the first interlayer.

The first interlayer may be a single layer (monolayer) or a plurality of layers of two or more layers, and, in a case in which the first interlayer is a plurality of layers, the respective layers in the plurality of layers may be identical to or different from one another, and the combination of the plurality of layers is not particularly limited.

The thickness of the first interlayer can be appropriately adjusted depending on the height of bumps on the semiconductor surface which is a protection target, but is preferably 50 to 600 μm, more preferably 70 to 500 μm, and particularly preferably 80 to 400 μm since it is possible to relatively easily absorb the influence of bumps having a relatively high height.

Here, "the thickness of the first interlayer" refers to the thickness of the entire first interlayer, and, for example, the thickness of the first interlayer made up of a plurality of layers refers to the total thickness of all of the layers constituting the first interlayer.

<<First Interlayer-Forming Composition>>

The first interlayer can be formed using a first interlayer-forming composition containing the constituent material.

For example, the first interlayer can be formed at an intended portion by applying the first interlayer-forming composition to a target surface on which the first interlayer is to be formed and drying the first interlayer-forming composition or curing the first interlayer-forming composition by irradiation with energy rays as necessary. A more specific method for forming the first interlayer will be described below in detail together with methods for forming other layers. The ratio between the contents of components, which do not gasify at normal temperature, in the first interlayer-forming composition is, generally, identical to the ratio between the contents of the above-described components in the first interlayer. Here, "normal temperature" is as described above.

The first interlayer composition may be applied using a well-known method, and examples thereof include methods in which a variety of coaters such as an air knife coater, a blade coater, a bar coater, a gravure coater, a roll coater, a roll knife coater, a curtain coater, a die coater, a knife coater, a screen coater, a Mayer bar coater, and a kiss coater are used.

The drying conditions of the first interlayer-forming composition are not particularly limited; however, in a case in which the first interlayer-forming composition contains a solvent described below, the first interlayer-forming composition is preferably heated and dried, and, in this case, the first interlayer-forming composition is preferably dried under conditions of, for example, 70° C. to 130° C. and 10 seconds to five minutes.

In a case in which the first interlayer-forming composition is energy ray-curable, the first interlayer-forming composition is preferably further cured by irradiation with energy rays after drying.

Examples of the first interlayer-forming composition include a first interlayer-forming composition (II-1) containing urethane (meth)acrylate and the like.

<First Interlayer-Forming Composition (II-1)>

As described above, the first interlayer-forming composition (II-1) contains urethane (meth)acrylate.

[Urethane (Meth)acrylate]

The urethane (meth)acrylate is a compound having at least a (meth)acryloyl group and a urethane bond in one molecule and is energy ray-polymerizable.

The urethane (meth)acrylate may be a monofunctional urethane (meth)acrylate (urethane (meth)acrylate having only one (meth)acryloyl group in one molecule) or may be a di- or higher-functional urethane (meth)acrylate (urethane (meth)acrylate having two or more (meth)acryloyl groups in one molecule), that is, a multifunctional urethane (meth) acrylate, but urethane (meth)acrylate having at least one (meth)acryloyl group is preferably used.

Examples of the urethane (meth)acrylate contained in the first interlayer-forming composition include urethane (meth) acrylate obtained by further causing a (meth)acrylic compound having a hydroxyl group and a (meth)acryloyl group to react with a terminal isocyanate urethane prepolymer obtained by reacting a polyol compound and a polyhydric isocyanate compound. Here, "the terminal isocyanate urethane prepolymer" refers to a prepolymer having a urethane bond and having an isocyanate group at a terminal portion of the molecule.

The first interlayer-forming composition (II-1) may contain one or two or more types of the urethane (meth)acrylate, and, in a case in which the first interlayer-forming composition contains two or more types of the urethane (meth) acrylate, the combination and ratio thereof can be arbitrarily selected.

(Polyol Compound)

The polyol compound is not particularly limited as long as the compound has two or more hydroxyl groups in one molecule.

One type of the polyol compound may be used singly or two or more types of the polyol compounds may be jointly used; however, in a case in which two or more types of the polyol compounds are jointly used, the combination and ratio thereof can be arbitrarily selected.

Examples of the polyol compound include alkylenediol, polyether-type polyols, polyester-type polyols, polycarbonate-type polyols, and the like.

The polyol compound may be any one of a difunctional diol, a trifunctional triol, and tetra- or higher-functional polyols, but a diol is preferred since the diol can be easily procured and is excellent in terms of versatility, reactivity, and the like.

• Polyether-Type Polyol

The polyether-type polyol is not particularly limited, but is preferably a polyether-type diol, and examples of the polyether-type diol include compounds represented by General Formula (1).

(In the formula, n represents an integer of 2 or more; R represents a divalent hydrocarbon group, and a plurality of R's may be identical to or different from one another.)

In the formula, n represents the number of repeating units of a group represented by General Formula "—R—O—" and is not particularly limited as long as n is an integer of 2 or more. Among these, n is preferably 10 to 250, more preferably 25 to 205, and particularly preferably 40 to 185.

In the formula, R is not particularly limited as long as R is a divalent hydrocarbon group, but is preferably an alkylene group, more preferably an alkylene group having 1 to 6 carbon atoms, still more preferably an ethylene group, a propylene group, or a tetramethylene group, and particularly preferably a propylene group or a tetramethylene group.

The compound represented by Formula (1) is preferably polyethylene glycol, polypropylene glycol or polytetramethylene glycol and more preferably polypropylene glycol or polytetramethylene glycol.

When the polyether-type diol and the polyhydric isocyanate compound are reacted with each other, urethane (meth) acrylate having an ether bond portion represented by General Formula (1a) as the terminal isocyanate urethane prepolymer can be obtained. In addition, when the above-described terminal isocyanate urethane prepolymer is used, the urethane (meth)acrylate has the ether bond portion, that is, has a constituent unit derived from the polyether-type diol.

(In the formula, R and n are the same as described above.)

• Polyester-Type Polyol

The polyester-type polyol is not particularly limited, and examples thereof include polyols obtained by causing an esterification reaction using a polybasic acid or a derivative thereof, and the like. Meanwhile, in the present specification, unless particularly otherwise described, "a derivative" refers to a compound in which one or more groups are substituted with other groups (substituents). Here, "a group" refers not only to an atomic group formed by bonding a plurality of atoms but also to one atom.

Examples of the polybasic acid or the derivative thereof include polybasic acids that are ordinarily used as a manufacturing raw material of polyesters and derivatives thereof.

Examples of the polybasic acids include saturated aliphatic polybasic acids, unsaturated aliphatic polybasic acids, aromatic polybasic acids, and the like, and dimers corresponding to any of the above-described polybasic acids may also be used.

Examples of the saturated aliphatic polybasic acids include saturated aliphatic dibasic acids such as oxalic acid, malonic acid, succinic acid, glutaric acid, adipic acid, pimelic acid, suberic acid, azelaic acid, and sebacic acid, and the like.

Examples of the unsaturated aliphatic polybasic acids include unsaturated aliphatic dibasic acids such as maleic acid and fumaric acid.

Examples of the aromatic polybasic acids include aromatic dibasic acids such as phthalic acid, isophthalic acid, terephthalic acid, and 2,6-naphthalenedicarboxylic acid; aromatic tribasic acids such as trimellitic acid; aromatic tetrabasic acids such as pyromellitic acid; and the like.

Examples of the derivatives of the polybasic acids include acid anhydrides of the saturated aliphatic polybasic acids, the unsaturated aliphatic polybasic acids, and the aromatic polybasic acids described above, hydrogenated dimer acids, and the like.

One type of any of the polybasic acids or the derivatives thereof may be used singly or two or more types of any of the polybasic acids or the derivatives thereof may be jointly used, and, in a case in which two or more types of any of the polybasic acids or the derivatives thereof are jointly used, the combination and ratio thereof can be arbitrarily selected.

The polybasic acid is preferably the aromatic polybasic acid since the aromatic polybasic acid is suitable for the formation of coated films having an appropriate hardness.

In the esterification reaction for obtaining the polyester-type polyol, a well-known catalyst may also be used as necessary.

Examples of the catalyst include tin compounds such as dibutyltin oxide and stannous octanoate; alkoxy titanium such as tetrabutyl titanate and tetrapropyl titanate; and the like.

• Polycarbonate-Type Polyol

The polycarbonate-type polyol is not particularly limited, and examples thereof include polycarbonate-type polyols obtained by reacting the same glycol as the compound represented by Formula (1) and alkylene carbonate, and the like.

Here, one type of any of the glycol and the alkylene carbonate may be used singly or two or more types of any of the glycol and the alkylene carbonate may be jointly used, and, in a case in which two or more types of any of the glycol and the alkylene carbonate are jointly used, the combination and ratio thereof can be arbitrarily selected.

The number-average molecular weight computed from the hydroxyl value of the polyol compound is preferably 1,000 to 10,000, more preferably 2,000 to 9,000, and particularly preferably 3,000 to 7,000. When the number-average molecular weight is 1,000 or more, the excess generation of urethane bonds is suppressed, and it becomes easier to control the viscoelastic characteristic of the first interlayer. In addition, when the number-average molecular weight is 10,000 or less, the excess softening of the first interlayer is suppressed.

The number-average molecular weight computed from the hydroxyl value of the polyol compound refers to a value computed from the following expression.

[The number-average molecular weight of the polyol compound]=[the number of functional groups in the polyol compound]×56.11×1,000/[the hydroxyl value of the polyol compound (unit: mgKOH/g)]

The polyol compound is preferably the polyether-type polyol and more preferably a polyether-type diol.

(Polyhydric Isocyanate Compound)

The polyhydric isocyanate compound that is reacted with the polyol compound is not particularly limited as long as the polyhydric isocyanate compound has two or more isocyanate groups.

One type of the polyhydric isocyanate compound may be used singly or two or more types of the polyhydric isocyanate compounds may be jointly used, and, in a case in which two or more types of the polyhydric isocyanate compounds are jointly used, the combination and ratio thereof can be arbitrarily selected.

Examples of the polyhydric isocyanate compound include chain-like diisocyanates such as tetramethylene diisocyanate, hexamethylene diisocyanate, and trimethylhexamethylene diisocyanate; cyclic aliphatic diisocyanates such as isophorone diisocyanate, norbornane diisocyanate, dicyclohexylmethane-4,4'-diisocyanate, dicyclohexylmethane-2,4'-diisocyanate, and ω,ω'-diisocyanate dimethylcyclohexane; aromatic diisocyanates such as 4,4'-diphenylmethane diisocyanate, tolylene diisocyanate, tetramethylene xylylene diisocyanate, and naphthalene-1,5-diisocyanate; and the like.

Among these, the polyhydric isocyanate compound is preferably isophorone diisocyanate, hexamethylene diisocyanate, or xylylene diisocyanate from the viewpoint of the handling property.

((Meth)acrylic Compound)

The (meth)acrylic compound that is reacted with the terminal isocyanate urethane prepolymer is not particularly limited as long as the compound has at least a hydroxyl group and a (meth)acryloyl group in one molecule.

One type of the (meth)acrylic compound may be used singly or two or more types of the (meth)acrylic compounds may be jointly used, and, in a case in which two or more types of the (meth)acrylic compounds are jointly used, the combination and ratio thereof can be arbitrarily selected.

Examples of the (meth)acrylic compound include hydroxyl group-containing (meth)acrylic acid esters such as 2-hyroxyethyl (meth)acrylate, 2-hydroxypropyl (meth)acrylate, 3-hydroxypropyl (meth)acrylate, 2-hyroxybutyl (meth)acrylate, 3-hyroxybuyl (meth)acrylate, 4-hydroxybutyl (meth)acrylate, 4-hydroxycyclohexyl (meth)acrylate, 5-hydroxycyclooctyl (meth)acrylate, 2-hydroxy-3-phenyloxypropyl (meth)acrylate, pentaerythritol tri(meth)acrylate, polyethylene glycol mono(meth)acrylate, and polypropylene glycol mono(meth)acrylate; hydroxyl group-containing (meth)acrylamides such as N-methylol (meth)acrylamide; reactants obtained by reacting (meth)acrylic acid with vinyl alcohol, vinyl phenol, or bisphenol A glycidyl ether; and the like.

Among these, the (meth)acrylic compound is preferably the hydroxyl group-containing (meth)acrylic acid ester, more preferably a hydroxyl group-containing alkyl (meth)acrylate, and particularly preferably 2-hydroxyethyl (meth)acrylate.

The reaction between the terminal isocyanate urethane prepolymer and the (meth)acrylic compound may be conducted using a solvent, a catalyst, and the like as necessary.

Conditions during the reaction between the terminal isocyanate urethane prepolymer and the (meth)acrylic compound may be appropriately adjusted, and, for example, the reaction temperature is preferably 60° C. to 100° C., and the reaction time is preferably one to four hours.

The urethane (meth)acrylate may be any of an oligomer, a polymer and a mixture of an oligomer and a polymer and is preferably an oligomer.

For example, the weight-average molecular weight of the urethane (meth)acrylate is preferably 1,000 to 100,000, more preferably 3,000 to 80,000, and particularly preferably 5,000 to 65,000. When the weight-average molecular weight is 1,000 or more, it becomes easy to optimize the hardness of the first interlayer due to the intermolecular force between structures derived from the urethane (meth)acrylate in polymers of the urethane (meth)acrylate and a polymerizable monomer described below.

Meanwhile, in the present specification, unless particularly otherwise described, the weight-average molecular weight refers to a polystyrene-equivalent value measured using gel permeation chromatography (GPC).

[Polymerizable Monomer]

The first interlayer-forming composition (II-1) may also contain, in addition to the urethane (meth)acrylate, a polymerizable monomer from the viewpoint of further improving the film-forming property.

The polymerizable monomer refers to polymerizable monomers except for oligomers and polymers which are energy ray-polymerizable and have a weight-average molecular weight of 1,000 or more and is preferably a compound having at least one (meth)acryloyl group in one molecule.

Examples of the polymerizable monomer include alkyl (meth)acrylates in which an alkyl group constituting the alkyl ester has 1 to 30 carbon atoms and has a chain-like shape; functional group-containing (meth)acrylic compounds having a functional group such as a hydroxyl group, an amide group, an amino group, or an epoxy group; (meth)acrylic acid esters having an aliphatic cyclic group; (meth)acrylic acid esters having an aromatic hydrocarbon group; (meth)acrylic acid esters having a heterocyclic group; compounds having a vinyl group; compounds having an allyl group; and the like.

Examples of the alkyl (meth)acrylates having a chain-like alkyl group having 1 to 30 carbon atoms include methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, tert-butyl (meth)acrylate, pentyl (meth)acrylate, hexyl (meth)acrylate, heptyl (meth)acrylate, n-octyl (meth)acrylate, isooctyl (meth)acrylate, 2-ethylhexyl (meth)acrylate, n-nonyl (meth)acrylate, isononyl (meth)acrylate, decyl (meth)acrylate, undecyl (meth)acrylate, dodecyl (meth)acrylate (also referred to as lauryl (meth)acrylate), tridecyl (meth)acrylate, tetradecyl (meth)acrylate (also referred to as myristyl (meth)acrylate), pentadecyl (meth)acrylate, hexadecyl (meth)acrylate (also referred to as palmityl (meth)acrylate), heptadecyl (meth)acrylate, octadecyl (meth)acrylate (also referred to as stearyl (meth)acrylate), isooctadecyl (meth)acrylate (also referred to as isostearyl (meth)acrylate), nonadecyl (meth)acrylate, icosyl (meth)acrylate, and the like.

Examples of functional group-containing (meth)acrylic acid derivatives include hydroxyl group-containing (meth)acrylic acid esters such as 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, and 4-hydroxybutyl (meth)acrylate; (meth)acrylamides such as (meth)acrylamide, N,N-dimethyl (meth)acrylamide, N-butyl (meth)acrylamide, N-methylol (meth)acrylamide, N-methylolpropane (meth)acrylamide, N-methoxymethyl (meth)acrylamide, and N-butoxymethyl (meth)acrylamide and derivatives thereof; (meth)acrylic acid esters having an amino group (hereinafter, in some cases, referred to as "the amino group-containing (meth) acrylic acid esters"); (meth)acrylic acid esters having a monosubstituted amino group which are formed by substituting one hydrogen atom in an amino group with a group other than a hydrogen atom (hereinafter, in some cases, referred to as "the monosubstituted amino group-containing (meth)acrylic acid esters"); (meth)acrylic acid esters having a disubstituted amino group which are formed by substituting two hydrogen atoms in an amino group with groups other than a hydrogen atom (hereinafter, in some cases, referred to as "the disubstituted amino group-containing (meth)acrylic acid esters"); (meth)acrylic acid esters having an epoxy group such as glycidyl (meth)acrylate and methylglycidyl (meth)acrylate (hereinafter, in some cases, referred to as "the epoxy group-containing (meth)acrylic acid esters"); and the like.

Here, "the amino group-containing (meth)acrylic acid ester" refers to a compound formed by substituting one or more hydrogen atoms in a (meth)acrylic acid ester with an amino group ($-NH_2$). Similarly, "the monosubstituted amino group-containing (meth)acrylic acid ester" refers to a compound formed by substituting one or two or more hydrogen atoms in a (meth)acrylic acid ester with a monosubstituted amino group, and "the disubstituted amino group-containing (meth)acrylic acid ester" refers to a compound formed by substituting one or two or more hydrogen atoms in a (meth)acrylic acid ester with a disubstituted amino group.

Examples of the group other than a hydrogen atom which substitutes the hydrogen atom (that is, the substituent) in "the monosubstituted amino group" and "the disubstituted amino group" include alkyl groups and the like.

Examples of the (meth)acrylic acid esters having an aliphatic cyclic group include isobornyl (meth)acrylate, dicyclopentenyl (meth)acrylate, dicyclopentanyl (meth)acrylate, dicyclopentenyloxyethyl (meth)acrylate, cyclohexyl (meth)acrylate, adamantyl (meth)acrylate, and the like.

Examples of the (meth)acrylic acid esters having an aromatic hydrocarbon group include phenyl hydroxypropyl (meth)acrylate, benzyl (meth)acrylate, 2-hyroxy-3-phenoxypropyl (meth)acrylate, and the like.

The heterocyclic group in the (meth)acrylic acid ester having a heterocyclic group may be any of an aromatic heterocyclic group and an aliphatic heterocyclic group.

Examples of the (meth)acrylic acid esters having the heterocyclic group include tetrahydrofurfuryl (meth)acrylate, (meth)acryloyl morpholine, and the like.

Examples of the compounds having a vinyl group include styrene, hydroxyethyl vinyl ether, hydroxybutyl vinyl ether, N-vinylformamide, N-vinylpyrrolidone, N-vinylcaprolactam, and the like.

Examples of the compounds having an allyl group include allyl glycidyl ethers and the like.

The polymerizable monomer preferably has a group having a relatively large volume since the compatibility with the urethane (meth)acrylate is favorable, examples thereof include (meth)acrylic acid esters having an aliphatic cyclic group, (meth)acrylic acid esters having an aromatic hydrocarbon group, and (meth)acrylic acid esters having a heterocyclic group, and (meth)acrylic acid esters having an aliphatic cyclic group are more preferred.

The first interlayer-forming composition (II-1) may contain one or two or more types of the polymerizable monomers, and, in a case in which the first interlayer-forming composition contains two or more types of the polymerizable monomers, the combination and ratio thereof can be arbitrarily selected.

In the first interlayer-forming composition (II-1), the content of the polymerizable monomer is preferably 10% to 99% by mass, more preferably 15% to 95% by mass, still more preferably 20% to 90% by mass, and particularly preferably 25% to 80% by mass of the total mass of the first interlayer-forming composition (II-1).

[Photopolymerization Initiator]

The first interlayer-forming composition (II-1) may also contain, in addition to the urethane (meth)acrylate and the polymerizable monomer, a photopolymerization initiator. The first interlayer-forming composition (II-1) containing the photopolymerization initiator sufficiently proceeds with a curing reaction even when irradiated with energy rays having a relatively low energy such as ultraviolet rays.

Examples of the photopolymerization initiator include benzoin compounds such as benzoin, benzoin methyl ether, benzoin ethyl ether, benzoin isopropyl ether, benzoin isobutyl ether, benzoin benzoate, methyl benzoin benzoate, and benzoin dimethyl ketal; acetophenone compounds such as 2-hydroxy-2-methyl-1-phenyl-propane-1-one, and 2,2-dimethoxy-1,2-diphenylethane-1-one; acylphosphine oxide compounds such as bis(2,4,6-trimethylbenzoyl)phenylphosphine oxide; sulfide compounds such as benzylphenyl sulfide and tetramethylthiuram monosulfide; α-ketol compounds such as 1-hydroxycyclohexyl phenyl ketone; azo compounds such as azobisisobutyronitrile; titanocene compounds such as titanocene; thioxanthone compounds such as thioxanthone; peroxide compounds; diketone compounds such as diacetyle; dibenzyl; and the like.

In addition, as the photopolymerization initiator, for example, a quinone compound such as 1-chloroanthraquinone; a photosensitizer such as amine; or the like can also be used.

Examples of the photopolymerization initiator in the first interlayer-forming composition (II-1) include the same photopolymerization initiators as those in the first pressure-sensitive adhesive composition (I-1).

The first interlayer-forming composition (II-1) may contain one or two or more types of the photopolymerization initiators, and, in a case in which the first interlayer-forming composition contains two or more types of the photopolymerization initiators, the combination and ratio thereof can be arbitrarily selected.

In the first interlayer-forming composition (II-1), the content of the photopolymerization initiator is preferably 0.01 to 20 parts by mass, more preferably 0.03 to 10 parts by mass, and particularly preferably 0.05 to 5 parts by mass of the content (100 parts by mass) of the urethane (meth) acrylate and the polymerizable monomer.

[Resin Components Other than Urethane (Meth)acrylate]

The first interlayer-forming composition (II-1) may also contain resin components other than the urethane (meth) acrylate as long as the effects of the present invention are not impaired.

The types of the resin components and the content thereof in the first interlayer-forming composition (II-1) may be appropriately selected depending on the purpose and are not particularly limited.

[Other Additives]

The first interlayer-forming composition (II-1) may also contain other additives which do not correspond to any of the above-described components as long as the effects of the present invention are not impaired.

Examples of the other additives include a variety of additives such as a crosslinking agent, an antistatic agent, an antioxidant, a chain transfer, a softening agent (plasticizer), a filler, an antirust agent, and a colorant (a pigment or a dye).

Examples of the chain transfer include thiol compounds having at least one thiol group (mercapto group) in one molecule.

Examples of the thiol compounds include nonyl mercaptan, 1-dodecanethiol, 1,2-ethanedithiol, 1,3-propandithiol, triazinethiol, triazinedithiol, triazinetrithiol, 1,2,3-propanetrithiol, tetraethylene glycol bis(3-mercaptopropionate), trimethylolpropane tris(3-mercaptopropionate), pentaerythritol tetrakis(3-mercaptopropionate), pentaerythritol tetrakisthioglycolate, dipentaerythritol hexakis(3-mercaptopropionate), tris[(3-mercaptopropionyloxy)-ethyl]-isocyanurate, 1,4-bis(3-mercaptobutyryloxy)butane, pentaerythritol tetrakis(3-mercaptobutylate), 1,3,5-tris(3-mercaptobutyloxyethyl)-1,3,5-triazine-2,4,6-(1H,3H,5H)-trione, and the like.

The first interlayer-forming composition (II-1) may contain one or two or more types of the other additives, and, in a case in which the first interlayer-forming composition contains two or more types of the other additives, the combination and ratio thereof can be arbitrarily selected.

In the first interlayer-forming composition (II-1), the content of the other additives is not particularly limited and may be appropriately selected depending on the type of the additives.

[Solvent]

The first interlayer-forming composition (II-1) may also contain a solvent. When the first interlayer-forming composition (II-1) contains a solvent, the coating aptitude to a coating target surface improves.

<<Method for Manufacturing First Interlayer-Forming Composition>>

The first interlayer-forming composition such as the first interlayer-forming composition (II-1) can be obtained by blending individual components for constituting the first interlayer-forming composition.

The addition order during the blending of the respective components is not particularly limited, and two or more types of components may be added at the same time.

In a case in which the solvent is used, the solvent may be used by mixing the solvent with all of the blending components other than the solvent so as to dilute these blending components in advance or may be used by mixing the solvent with the blending components without diluting all of the blending components other than the solvent in advance.

A method for mixing the respective components during blending is not particularly limited and may be appropriately selected from well-known methods such as a method in which the components are mixed together by rotating a stirring stick, a stirring blade, or the like; a method in which the components are mixed together using a mixer, and a method in which the components are mixed together by applying ultrasonic waves thereto.

The temperature and the time during the addition and mixing of the respective components are not particularly limited as long as the respective blending components do not deteriorate and may be appropriately adjusted, but the temperature is preferably 15° C. to 30° C.

Curable Resin Layer

The curable resin layer is a sheet-form or film-form layer for protecting bumps on the semiconductor surface and may be any of an energy ray-curable resin layer and a thermosetting resin layer. The curable resin layer forms the first protective film by curing.

The energy ray-curable resin layer contains an energy ray-curable component (a).

The energy ray-curable component (a) is preferably uncured and is preferably pressure-sensitive adhesive and more preferably uncured and pressure-sensitive adhesive. Here, "energy rays" and "being energy ray-curable" are as described above.

Examples of a preferred thermosetting resin layer include thermosetting resin layers containing a polymer component (A) and a thermosetting component (B). The polymer component (A) is a component considered to be formed by a polymerization reaction of a polymerizable compound. In addition, the thermosetting component (B) is a component capable of a curing (polymerization) reaction. Meanwhile, in the present invention, a polycondensation reaction is also considered as the polymerization reaction.

The curable resin layer may be a single layer (monolayer) or a plurality of layers of two or more layers, and, in a case in which the curable resin layer is a plurality of layers, the respective layers in the plurality of layers may be identical to or different from one another, and the combination of the plurality of layers is not particularly limited.

A preferred thickness of the curable resin layer is as described above, and, here, "the thickness of the curable resin layer" refers to the thickness of the entire curable resin layer, and, for example, the thickness of the curable resin layer made up of a plurality of layers refers to the total thickness of all of the layers constituting the curable resin layer.

The thermosetting resin layer preferably has an average viscosity during melting at 70° C. to 90° C. of 1 to 20,000 Pa·s and a surface free energy at 23° C. of 35 to 40 mJ/m$^2$.

In addition, the thermosetting resin layer can be formed using a thermosetting resin layer-forming composition containing a constituent material thereof.

Therefore, the average viscosity and the surface free energy of the thermosetting resin layer can be adjusted by adjusting any one or both of the types and amounts of components contained in the thermosetting resin layer-forming composition.

In the present specification, "the average viscosity during melting at 70° C. to 90° C." of the thermosetting resin layer can be obtained by using, for example, a 20 μm-thick thermosetting resin film as the thermosetting resin layer, changing the temperature of the thermosetting resin film from 70° C. to 90° C., at this time, measuring the melt viscosity of the thermosetting resin film whenever the temperature of the thermosetting resin film reaches every temperature such as 70° C., 71° C., 72° C., . . . , 88° C., 89° C., and 90° C., and computing the average value of the obtained 21 measurement values. The melt viscosity can be measured using, for example, a capillary rheometer (flow tester, "CFT-100D" manufactured by Shimadzu Corporation).

In the present specification, "the surface free energy at 23° C." of the thermosetting resin layer can be obtained by, for example, using a 20 μm-thick thermosetting resin film as the thermosetting resin layer, measuring the contact angles of water, 1-bromonaphthalene, and diiodomethane with respect to the thermosetting resin film at 23° C., and applying the Kitazaki and Hata method using the measurement values. The contact angles can be measured after, for example, the measurement target of the thermosetting resin film is placed in an environment of 23° C. and stabilized at the temperature. The contact angles can be measured using, for example, a contact angle measurement instrument (fully automatic contact angle meter, "DM-701" manufactured by Kyowa Interface Science Co., Ltd.), and, in the present specification, regarding the measurement of the contact angles, it is possible to measure the contact angle five times for each of all of the above-described solvents (water, 1-bromonaphthalene, and diiodomethane) and employ the average value of the obtained five measurement values as the contact angle of the solvent.

The thermosetting resin layer-forming composition and a method for manufacturing the same will be described below in detail.

For example, when the content in the composition of components that increase the viscosity in particular among the components contained in the thermosetting resin layer-forming composition is decreased, it is possible to more easily adjust the average viscosity to a preferred range. Examples of the components that increase the viscosity include a filler (D) described below and the like, but are not limited thereto.

In addition, for example, when the content in the composition of components that decrease the viscosity in particular among the components contained in the thermosetting resin layer-forming composition is increased, it is possible to more easily adjust the average viscosity to a preferred range. Examples of the components that decrease the viscosity include a thermoplastic resin described below and the like, but are not limited thereto.

In addition, for example, when the content in the composition of a thermal curing agent in particular among the components contained in the thermosetting resin layer-forming composition is decreased or a thermal curing agent having a mold effect is used, it is possible to more easily adjust the average viscosity to a preferred range. The thermal curing agent can be appropriately selected from a thermal curing agent (B2) described below and the like, but is not limited thereto.

<<Curable Resin Layer-Forming Composition>>

The curable resin layer can be formed using a curable resin layer-forming composition containing a constituent material thereof. For example, the energy ray-curable resin layer can be formed at an intended portion by applying an energy ray-curable resin layer-forming composition to a target surface on which the energy ray-curable resin layer is to be formed and drying the energy ray-curable resin layer-forming composition as necessary. The ratio between the contents of components, which do not gasify at normal temperature, in the energy ray-curable resin layer-forming composition is, generally, identical to the ratio between the contents of the above-described components in the energy ray-curable resin layer. Here, "normal temperature" is as described above.

The curable resin layer-forming composition may be applied using a well-known method, and examples thereof include methods in which a variety of coaters such as an air knife coater, a blade coater, a bar coater, a gravure coater, a roll coater, a roll knife coater, a curtain coater, a die coater, a knife coater, a screen coater, a Mayer bar coater, and a kiss coater are used.

The drying conditions of the resin layer-forming composition are not particularly limited; however, in a case in which the energy ray-curable resin layer-forming composition contains a solvent described below, the energy ray-curable resin layer-forming composition is preferably heated and dried, and, in this case, the curable resin layer-forming composition is preferably dried under conditions of, for example, 70° C. to 130° C. for 10 seconds to five minutes.

<Energy Ray Resin Layer-Forming Composition (IV-1)>

Examples of the energy ray-curable resin layer-forming composition include an energy ray-curable resin layer-forming composition (IV-1) containing the energy ray-curable component (a) (in the present specification, in some cases, abbreviated as "the resin layer-forming composition (IV-1)") and the like.

[Energy Ray-Curable Component (a)]

The energy ray-curable component (a) is a component that is cured by irradiation with energy rays and is a component for imparting a film-forming property, flexibility, and the like to the energy ray-curable resin layer.

Examples of the energy ray-curable component (a) include a polymer (a1) which has an energy ray-curable group and a weight-average molecular weight of 80,000 to 2,000,000 and a compound (a2) which has an energy ray-curable group and a molecular weight of 100 to 80,000. The polymer (a1) may be a polymer at least a part of which is crosslinked using a crosslinking agent or a polymer which is not crosslinked.

(Polymer (a1) Having Energy Ray-Curable Group and Weight-Average Molecular Weight of 80,000 to 2,000,000)

Examples of the polymer (a1) which has an energy ray-curable group and a weight-average molecular weight of 80,000 to 2,000,000 include an acrylic resin (a1-1) formed by polymerizing an acrylic polymer (a11) having a functional group capable of reacting with groups in other compounds and an energy ray-curable compound (a12) having a group that reacts with the functional group and an energy ray-curable group such as an energy ray-curable double bond.

Examples of the functional group capable of reacting with groups in other compounds include a hydroxyl group, a carboxy group, an amino group, a substituted amino group (a group formed by substituting one or two hydrogen atoms in an amino group with a group other than a hydrogen atom), an epoxy group, and the like. Here, the functional group is preferably a group other than a carboxy group from the viewpoint of preventing the corrosion of circuits of semiconductor wafers, semiconductor chips or the like.

Among these, the functional group is preferably a hydroxyl group.

• Acrylic Polymer (a11) Having Functional Group

Examples of the acrylic polymer (a11) having the functional group include acrylic polymers formed by copolymerizing an acrylic monomer having the above-described functional group and an acrylic monomer not having the above-described functional group, and the acrylic polymer may be an acrylic polymer formed by copolymerizing the above-described monomers and, furthermore, a monomer other than acrylic monomers (non-acrylic monomer).

In addition, the acrylic polymer (a11) may be a random copolymer or a block copolymer.

Examples of the acrylic monomer having the functional group include hydroxyl group-containing monomers, carboxy group-containing monomers, amino group-containing monomers, substituted amino group-containing monomers, epoxy group-containing monomers, and the like.

Examples of the hydroxyl group-containing monomers include hydroxyalkyl (meth)acrylates such as hydroxymethyl (meth)acrylate, 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, and 4-hydroxybutyl (meth)acrylate; non-(meth)acrylic unsaturated alcohols such as vinyl alcohol and allyl alcohol (unsaturated alcohols not having a (meth)acryloyl skeleton); and the like.

Examples of the carboxy group-containing monomers include ethylenic unsaturated monocarboxylic acids such as (meth)acrylic acid and crotonic acid (monocarboxylic acids having an ethylenic unsaturated bond); ethylenic unsaturated dicarboxylic acids such as fumaric acid, itaconic acid, maleic acid, and citraconic acid (dicarboxylic acids having an ethylenic unsaturated bond); anhydrides of the ethylenic unsaturated dicarboxylic acid; carboxyalkyl (meth)acrylates such as 2-carboxyethyl methacrylate; and the like.

The acrylic monomer having the functional group is preferably the hydroxyl group-containing monomer or the carboxy group-containing monomer and more preferably the hydroxyl group-containing monomer.

The acrylic polymer (a11) may be constituted of one or two or more types of the acrylic monomers having the functional group, and, in a case in which the acrylic polymer is constituted of two or more types of the acrylic monomers having the functional group, the combination and ratio thereof can be arbitrarily selected.

Examples, examples of the acrylic monomer not having the functional group include alkyl (meth)acrylates in which an alkyl group constituting the alkyl ester has 1 to 18 carbon atoms and has a chain-like shape such as methyl (meth) acrylate, ethyl (meth)acrylate, n-propyl (meth)acrylate, isopropyl (meth)acrylate, n-butyl (meth)acrylate, isobutyl (meth)acrylate, sec-butyl (meth)acrylate, tert-butyl (meth) acrylate, pentyl (meth)acrylate, hexyl (meth)acrylate, heptyl (meth)acrylate, 2-ethylhexyl (meth)acrylate, isooctyl (meth) acrylate, n-octyl (meth)acrylate, n-nonyl (meth)acrylate, isononyl (meth)acrylate, decyl (meth)acrylate, undecyl (meth)acrylate, dodecyl (meth)acrylate (also referred to as lauryl (meth)acrylate), tridecyl (meth)acrylate, tetradecyl (meth)acrylate (also referred to as myristyl (meth)acrylate), pentadecyl (meth)acrylate, hexadecyl (meth)acrylate (also referred to as palmityl (meth)acrylate), heptadecyl (meth) acrylate, and octadecyl (meth)acrylate (also referred to as stearyl (meth)acrylate) and the like.

In addition, examples of the acrylic monomer not having the functional group also include alkoxyalkyl group-containing (meth)acrylic acid esters such as methoxymethyl (meth)acrylate, methoxyethyl (meth)acrylate, ethoxymethyl (meth)acrylate, and ethoxyethyl (meth)acrylate; (meth) acrylic acid esters having an aromatic group which includes allyl (meth)acrylate such as phenyl (meth)acrylate or the like; non-crosslinkable (meth)acrylamides and derivatives thereof; (meth)acrylic acid esters having a non-crosslinkable tertiary amino group such as N,N-dimethylaminoethyl (meth)acrylate and N,N-dimethylaminopropyl (meth)acrylate; and the like.

The acrylic polymer (a11) may be constituted of one or two or more types of the acrylic monomers not having the functional group, and, in a case in which the acrylic polymer is constituted of two or more types of the acrylic monomers not having the functional group, the combination and ratio thereof can be arbitrarily selected.

Examples of the non-acrylic monomer include olefins such as ethylene and norbornene; vinyl acetate; styrene; and the like.

The acrylic polymer (a11) may be constituted of one or two or more types of the non-acrylic monomers, and, in a case in which the acrylic polymer is constituted of two or more types of the non-acrylic monomers, the combination and ratio thereof can be arbitrarily selected.

The ratio (content) of a constituent unit derived from the acrylic monomer having the functional group to the total mass of constituent units constituting the acrylic polymer (a11) is preferably 0.1% to 50% by mass, more preferably 1% to 40% by mass, and particularly preferably 3% to 30% by mass. When the ratio is in the above-described range, in the acrylic resin (a1-1) obtained by the copolymerization of the acrylic polymer (a11) and the energy ray-curable compound (a12), it becomes possible to easily adjust the degree of curing of the first protective film to a preferred range with the content of the energy ray-curable group.

The acrylic resins (a1-1) may be constituted of one or two or more types of the acrylic polymer (a11), and, in a case in which the acrylic resin is constituted of two or more types of the acrylic polymers, the combination and ratio thereof can be arbitrarily selected.

In the resin layer-forming composition (IV-1), the content of the acrylic resin (a1-1) is preferably 1% to 40% by mass, more preferably 2% to 30% by mass, and particularly preferably 3% to 20% by mass of the total mass of the resin layer-forming composition (IV-1).

• Energy Ray-Curable Compound (a12)

The energy ray-curable compound (a12) is preferably an energy ray-curable compound having one or two or more types of groups selected from the group consisting of an isocyanate group, an epoxy group, and a carboxy group as the group capable of reacting with the functional group in the acrylic polymer (a11) and more preferably an energy ray-curable compound having an isocyanate group as the above-described group. For example, in a case in which the energy ray-curable compound (a12) has an isocyanate group as the above-described group, this isocyanate group easily reacts with a hydroxyl group in the acrylic polymer (a11) having the hydroxyl group as the functional group.

The number of the energy ray-curable groups in one molecule of the energy ray-curable compound (a12) is preferably 1 to 5 and more preferably 1 or 2.

Examples of the energy ray-curable compound (a12) include 2-methacryloyloxyethyl isocyanate, methaisoprepenyl-α,α-dimethylbenzyl isocyanate, methacryloyl isocyanate, ally isocyanate, 1,1-(bisacryloyloxymethyl)ethyl isocyanate;

acryloyl monoisocyanate compounds obtained by a reaction between a diisocyante compound or a polyisocyanate compound and hydroxyethyl (meth)acrylate;

acryloyl monoisocyanate compounds obtained from a reaction among a diisocyante compound or a polyisocyanate compound, a polyol compound, and hydroxyethyl (meth) acrylate; and the like.

Among these, the energy ray-curable compound (a12) is preferably 2-methacryloyloxyethyl isocyanate.

The acrylic resins (a1-1) may be constituted of one or two or more types of the energy ray-curable compound (a12), and, in a case in which the acrylic resin is constituted of two or more types of the energy ray-curable compounds, the combination and ratio thereof can be arbitrarily selected.

The ratio of the content of an energy ray-curable group derived from the energy ray-curable compound (a12) to the content of the functional group derived from the acrylic polymer (a11) in the acrylic resin (a1-1) is preferably 20 to 120 mol %, more preferably 35 to 100 mol %, and particularly preferably 50 to 100 mol %. When the ratio of the content is in the above-described range, the adhesive force of the first protective film after curing becomes stronger. Meanwhile, in a case in which the energy ray-curable compound (a12) is a monofunctional compound (having one functional group in one molecule), the upper limit value of the ratio of the content becomes 100 mol %; however, in a case in which the energy ray-curable compound (a12) is a polyfunctional compound (having two or more functional groups in one molecule), the upper limit value of the content exceeds 100 mol % in some cases.

The weight-average molecular weight (Mw) of the polymer (a1) is preferably 100,000 to 2,000,000 and more preferably 300,000 to 1,500,000.

Here, "the weight-average molecular weight" is as described above.

In a case in which at least a part of the polymer (a1) is crosslinked with a crosslinking agent, the polymer (a1) may be a polymer that is formed by polymerizing monomers which do not correspond to any of the monomers described above as the monomers constituting the acrylic polymer (a11) and have a group that reacts with the crosslinking agent and is crosslinked in the group that reacts with the crosslinking agent or may be a polymer crosslinked in a group which is derived from the energy ray-curable compound (a12) and reacts with the functional group.

The resin layer-forming composition (IV-1) and the energy ray-curable resin layer may contain one or two or more types of the polymers (a1), and, in a case in which the resin layer-forming composition and the energy ray-curable resin layer contain two or more types of the polymers, the combination and ratio thereof can be arbitrarily selected.

(Compound (a2) Having Energy Ray-Curable Group and Molecular Weight of 100 to 80,000)

Examples of the energy ray-curable group in the compound (a2) which has an energy ray-curable group and a molecular weight of 100 to 80,000 include groups having an energy ray-curable double bond, and preferred examples thereof include a (meth)acryloyl group, a vinyl group, and the like.

The compound (a2) is not particularly limited as long as the compound satisfies the above-described conditions, and examples thereof include low-molecular-weight compounds having an energy ray-curable group, epoxy resins having an energy ray-curable group, phenol resins having an energy ray-curable group, and the like.

Among the compound (a2), examples of the low-molecular-weight compounds having an energy ray-curable group include polyfunctional monomers, oligomers, and the like, and acrylate-based compounds having a (meth)acryloyl group are preferred.

Examples of the acrylate-based compounds include difunctional (meth)acrylates such as 2-hydroxy-3-(meth) acryloyloxypropoyl methacrylate, polyethylene glycol di(meth)acrylate, propoxylated ethoxylated bisphenol A di(meth)acrylate, 2,2-bis[4-((meth)acryloxypolyethoxy) phenyl]propane, ethoxylated bisphenol A di(meth)acrylate, 2,2-bis[4-((meth)acryloxydiethoxy)phenyl]propane, 9,9-bis [4-(2-(meth)acryloyloxyethoxy)phenyl]fluorene, 2,2-bis[4-((meth)acryloxypolypropoxy)phenyl]propane, tricyclodecanedimethanol di(meth)acrylate, 1,10-decanediol di(meth) acrylate, 1,6-hexanediol di(meth)acrylate, 1,9-nonanediol di(meth)acrylate, dipropylene glycol di(meth)acrylate, tripropylene glycol di(meth)acrylate, polypropylene glycol di(meth)acrylate, polytetramethylene glycol di(meth)acrylate, ethylene glycol di(meth)acrylate, diethylene glycol di(meth)acrylate, triethylene glycol di(meth)acrylate, 2,2-bis[4-((meth)acryloylethoxy)phenyl]propane, neopentyl glycol di(meth)acrylate, ethoxylated polypropylene glycol di(meth)acrylate, and 2-hydroxy-1,3-di(meth)acryloxypropane;

polyfunctional (meth)acrylates such as tris(2-(meth)acryloxyethyl) isocyanurate, ε-caprolacton-modified tris-(2-(meth)acryloxyethyl) isocyanurate, ethoxylated glycerin tri (meth)acrylate, pentaerythritol tri(meth)acrylate, trimethylolpropane tri(meth)acrylate, ditrimethylolpropane tetra(meth)acrylate, ethoxylated pentaerythritol tetra(meth)acrylate, pentaerythritol tetra(meth)acrylate, dipentaerythritol poly(meth)acrylate, and dipentaerythritol hexa(meth)acrylate;

polyfunctional (meth)acrylate oligomers such as urethane (meth)acrylate oligomers; and the like.

Among the compound (a2), as the epoxy resins having an energy ray-curable group, the phenolic resins having an energy ray-curable group, for example, the resins described in Paragraph 0043 and the like of "Japanese Unexamined Patent Application, First Publication No. 2013-194102" can be used. These resins also correspond to resins constituting a curable component described below; however, in the present invention, the resins will be handled as the compound (a2).

The weight-average molecular weight of the compound (a2) is preferably 100 to 30,000 and more preferably 300 to 10,000.

The resin layer-forming composition (IV-1) and the energy ray-curable resin layer may contain one or two or more types of the compounds (a2), and, in a case in which the resin layer-forming composition and the energy ray-curable resin layer contain two or more types of the compounds, the combination and ratio thereof can be arbitrarily selected.

[Polymer (b) not Having Energy Ray-Curable Group]

In the case of containing the compound (a2) as the energy ray-curable component (a), the resin layer-forming composition (IV-1) and the energy ray-curable resin layer preferably further contain a polymer (b) not having any energy ray-curable groups.

The polymer (b) may be a polymer at least a part of which is crosslinked with a crosslinking agent or a polymer which is not crosslinked.

Examples of the polymer (b) not having any energy ray-curable group include acrylic polymers, phenoxy resins, urethane resins, polyesters, rubber-based resins, acrylic urethane resins, and the like.

Among these, the polymer (b) is preferably an acrylic polymer (hereinafter, in some cases, abbreviated as "the acrylic polymer (b-1)").

The acrylic polymer (b-1) may be a well-known acrylic polymer, and, for example, the acrylic polymer may be a homopolymer of one type of acrylic monomer, a copolymer of two or more types of acrylic monomers, or a copolymer of one or two or more types of acrylic monomers and one or two or more types of monomers other than acrylic monomers (non-acrylic monomers).

Examples of the acrylic monomer constituting the acrylic polymer (b-1) include alkyl (meth)acrylates, (meth)acrylic acid esters having a cyclic skeleton, glycidyl group-containing (meth)acrylic acid esters, hydroxyl group-containing (meth)acrylic acid esters, substituted amino group-containing (meth)acrylic acid esters, and the like. Here, "the substituted amino group" is as described above.

Examples of the alkyl (meth)acrylates include alkyl (meth)acrylates in which an alkyl group constituting the alkyl ester has 1 to 18 carbon atoms and has a chain-like shape such as methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, tert-butyl (meth)acrylate, pentyl (meth)acrylate, hexyl (meth)acrylate, heptyl (meth)acrylate, 2-ethylhexyl (meth)acrylate, isooctyl (meth)acrylate, n-octyl (meth)acrylate, n-nonyl (meth)acrylate, isononyl (meth)acrylate, decyl (meth)acrylate, undecyl (meth)acrylate, dodecyl (meth)acrylate (also referred to as lauryl (meth)acrylate), tridecyl (meth)acrylate, tetradecyl (meth)acrylate (also referred to as myristyl (meth)acrylate), pentadecyl (meth)acrylate, hexadecyl (meth)acrylate (also referred to as palmityl (meth)acrylate), heptadecyl (meth)acrylate, and octadecyl (meth)acrylate (also referred to as stearyl (meth)acrylate); and the like.

Examples of the (meth)acrylic acid esters having a cyclic skeleton include cycloalkyl (meth)acrylates such as isobornyl (meth)acrylate and dicyclopentanyl (meth)acrylate;

aralkyl (meth)acrylates such as benzyl (meth)acrylate;

cycloalkenyl (meth)acrylates such as dicyclopentenyl (meth)acrylate;

cycloalkenyloxy alkyl (meth)acrylate such as dicyclopentenyloxyethyl (meth)acrylate; and the like.

Examples of the glycidyl group-containing (meth)acrylic acid esters include glycidyl (meth)acrylate and the like.

Examples of the hydroxyl group-containing (meth)acrylic acid esters include hydroxymethyl (meth)acrylate, 2-hydroxyethyl (meth)acrylate, 2-hydroxypropyl (meth)acrylate, 3-hydroxypropyl (meth)acrylate, 2-hydorybutyl (meth)acrylate, 3-hydroxybutyl (meth)acrylate, 4-hydroxybutyl (meth)acrylate, and the like.

Examples of the substituted amino group-containing (meth)acrylic acid esters include N-methylaminoethyl (meth)acrylate and the like.

Examples of the non-acrylic monomer constituting the acrylic polymer (b-1) include olefins such as ethylene and norbornene; vinyl acetate; styrene; and the like.

Examples of the polymer (b) at least a part of which is crosslinked with a crosslinking agent and which does not have the energy ray-curable group include polymers in which a reactive functional group in the polymer (b) reacts with a crosslinking agent.

The reactive functional group may be appropriately selected depending on the type and the like of the crosslinking agent and is not particularly limited. For example, in a case in which the crosslinking agent is a polyisocyanate compound, examples of the reactive functional group include a hydroxyl group, a carboxy group, an amino group, and the like, and, among these, the hydroxyl group that is highly reactive with isocyanate groups is preferred. In addition, in a case in which the crosslinking agent is an epoxy-based compound, examples of the reactive functional group include a carboxy group, an amino group, an amide group, and the like, and, among these, the carboxy group that is highly reactive with epoxy groups is preferred. Here, the reactive functional group is preferably a group other than a carboxy group from the viewpoint of preventing the corrosion of circuits of semiconductor wafers or semiconductor chips.

Examples of the polymer (b) which has the reactive functional group but does not have any energy ray-curable groups include polymers obtained by polymerizing monomers having at least the reactive functional group. In the case of the acrylic polymer (b-1), as any one or both of the acrylic monomer and the non-acrylic monomer that have been exemplified as the monomers constituting the acrylic polymer, monomers having the reactive functional group may be used. For examples, examples of the polymer (b) having a hydroxyl group as the reactive functional group include polymers obtained by polymerizing hydroxyl group-containing (meth)acrylic acid and also include polymers obtained by polymerizing monomers formed by substituting one or two or more hydrogen atoms in the previously exemplified acrylic monomer or non-acrylic monomer with the reactive functional group.

In the polymer (b) having the reactive functional group, the ratio (content) of the amount of a constituent unit derived from a monomer having the reactive functional group is preferably 1 to 20% by mass and more preferably 2 to 10% by mass of the total mass of constituent units constituting the polymer. When the ratio is in the above-described range, in the polymer (b), the degree of crosslinking is in a more preferred range.

The weight-average molecular weight (Mw) of the polymer (b) not having any energy ray-curable groups is preferably 10,000 to 2,000,000 and more preferably 100,000 to 1,500,000 since the film-forming property of the resin layer-forming composition (IV-1) becomes more favorable. Meanwhile, in the present specification, unless particularly otherwise described, the weight-average molecular weight refers to a polystyrene-equivalent value measured using gel permeation chromatography (GPC).

The resin layer-forming composition (IV-1) and the energy ray-curable resin layer may contain one or two or more types of the polymers (b) not having any energy ray-curable groups, and, in a case in which the resin layer-forming composition and the energy ray-curable resin layer contain two or more types of the polymers not having any energy ray-curable groups, the combination and ratio thereof can be arbitrarily selected.

Examples of the resin layer-forming composition (IV-1) include compositions containing any one or both of the polymer (a1) and the compound (a2). In addition, in the case of containing the compound (a2), the resin layer-forming composition (IV-1) preferably further contains the polymer (b) not having any energy ray-curable groups, and, in this case, the resin layer-forming composition preferably further contains the (a1). In addition, the resin layer-forming composition (IV-1) may contain the polymer (a1) and the polymer (b) not having any energy ray-curable groups without containing the compound (a2).

In a case in which the resin layer-forming composition (IV-1) contains the polymer (a1), the compound (a2), and the polymer (b) not having any energy ray-curable groups, in the resin layer-forming composition (IV-1), the content of the compound (a2) is preferably 10 to 400 parts by mass and more preferably 30 to 350 parts by mass of the total content (100 parts by mass) of the polymer (a1) and the polymer (b) not having any energy ray-curable groups.

In the resin layer-forming composition (IV-1), the ratio of the total content of the energy ray-curable component (a) and the polymer (b) not having any energy ray-curable groups (that is, the total content of the energy ray-curable component (a) and the polymer (b) not having any energy ray-curable groups in the energy ray-curable resin layer) to the total content of the components other than the solvent is preferably 5% to 90% by mass, more preferably 10% to 80% by mass, and particularly preferably 20% to 70% by mass. When the ratio of the content of the energy ray-curable component is in the above-described range, the energy ray-curing property of the energy ray-curable resin layer becomes more favorable.

The resin layer-forming composition (IV-1) may also contain, in addition to the energy ray-curable component, one or two or more types of elements selected from the group consisting of a thermosetting component, a photopolymerization initiator, a filler, a coupling agent, a crosslinking agent, and a versatile additive depending on the purpose. For example, when the resin layer-forming composition (IV-1) containing the energy ray-curable component and a thermosetting component is used, the adhesive force of an energy ray-curable resin layer to be formed to adherends improves by heating, and the strength of the first protective film formed of this energy ray-curable resin layer also improves.

[Thermosetting Component (B)]

The resin layer-forming composition (IV-1) and the curable resin layer may also contain a thermosetting component (B). When the curable resin layer contains the thermosetting component (B), the thermosetting component (B) cures the curable resin layer by heating and thus forms a hard first protective film.

The description of the resin layer-forming composition (IV-1) and the thermosetting component (B) contained in the curable resin layer is the same as the description of the thermosetting component (B) contained in a resin layer-forming composition (III-1).

[Photopolymerization Initiator (H)]

The resin layer-forming composition (IV-1) may also contain a photopolymerization initiator (H).

Examples of the photopolymerization initiator (H) in the resin layer-forming composition (IV-1) include the same photopolymerization initiators as those in the first pressure-sensitive adhesive composition (I-1).

The resin layer-forming composition (IV-1) may contain one or two or more types of the photopolymerization initiators (H), and, in a case in which the resin layer-forming composition contains two or more types of the photopolymerization initiators, the combination and ratio thereof can be arbitrarily selected.

In the resin layer-forming composition (IV-1), the content of the photopolymerization initiator (H) is preferably 0.1 to 20 parts by mass, more preferably 1 to 10 parts by mass, and particularly preferably 2 to 5 parts by mass of the content (100 parts by mass) of the energy ray-curable component (a).

[Filler (D)]

The resin layer-forming composition (IV-1) and the curable resin layer may also contain a filler (D). When the content of the filler (D) in the curable resin layer is adjusted, it is possible to adjust the wetting and spreading property of the curable resin layer. That is, it is possible to decrease the wetting and spreading property by increasing the content of the filler (D), and it is possible to increase the wetting and spreading property by decreasing the content of the filler (D). In addition, when the curable resin layer contains the filler (D), the adjustment of the thermal expansion coefficient of the first protective film obtained by curing the curable resin layer becomes easy, and, when this thermal expansion coefficient is optimized for a subject on which the first protective film is to be formed, the reliability of packages obtained using the first protective film-forming sheet further improves. In addition, when the curable resin layer contains the filler (D), it is also possible to decrease the moisture absorptivity of the first protective film or improving the heat dissipation property.

The filler (D) may be any one of an organic filler and an inorganic filler, but is preferably an inorganic filler.

Examples of preferred inorganic fillers include powder of silica, alumina, talc, calcium carbonate, titanium white, colcothar, silicon carbide, boron nitride, and the like; beads obtained by spherodizing this inorganic filler; surface-modified products of these inorganic fillers; single crystal fibers of these inorganic fibers; glass fibers; and the like. More specific examples thereof include spherical silica modified with an epoxy group and the like.

Among these, the inorganic filler is preferably silica, alumina, or surface-modified silica. In addition, the average particle diameter of the inorganic filler is preferably 5 nm to 800 nm, more preferably 10 nm to 300 nm, still more preferably 30 nm to 100 nm, and particularly preferably 40 nm to 60 nm. Here, the average particle diameter can be obtained using dynamic light scattering (DLS) and can be measured using, for example, a particle size distribution meter such as Nanotrac Wave (manufactured by Microtrac).

The resin layer-forming composition (IV-1) and the curable resin layer may contain one or two or more types of the fillers (D), and, in a case in which the resin layer-forming composition and the curable resin layer contain two or more types of the fillers, the combination and ratio thereof can be arbitrarily selected.

In a case in which the filler (D) is used, in the resin layer-forming composition (IV-1), the ratio of the content of the filler (D) (that is, the content of the filler (D) in the curable resin layer) to the total content of all of the components other than the solvent is preferably 5% to 80% by mass, more preferably 7% to 60% by mass, still more preferably 18% to 45% by mass, and particularly preferably 18% to 25% by mass. When the content of the filler (D) is in the above-described range, it is possible to appropriately adjust the wetting and spreading property of the curable resin layer.

[Coupling Agent (E)]

The resin layer-forming composition (IV-1) and the curable resin layer may also contain a coupling agent (E). When a coupling agent having a functional group capable of reacting with an inorganic compound or an organic compound is used as the coupling agent (E), it is possible to improve the adhesiveness and adhesion of the curable resin layer to adherends. In addition, when the coupling agent (E) is used, the first protective film obtained by curing the curable resin layer is not impaired in the thermal resistance and is improved in terms of the water resistance.

The coupling agent (E) is preferably a compound having a functional group capable of reacting with the functional group in the energy ray-curable component (a) or the like and more preferably a silane coupling agent.

Examples of preferred silane coupling agents include 3-glycidyloxypropyltrimethoxysilane, 3-glycidyloxypropylmethyldiethoxysilane, 3-glycidyloxypropyltriethoxysilane, 3-glycidyloxymethyldiethoxysilane, 2-(3,4-epoxycyclohexyl)ethyltrimethoxysilane, 3-methacryloyloxypropyltrimethoxysilane, 3-aminopropyltrimethoxysilane, 3-(2-aminoethylamino)propyltrimethoxysilane, 3-(2-aminoethylamino)propylmethyldiethoxysilane, 3-(phenylamino)propyltrimethoxysilane, 3-anilinopropyltrimethoxysilane, 3-ureidopropyltrimethoxysilane, 3-mercaptopropyltrimethoxysilane, 3-mercaptopropylmethyldimethoxysilane, bis(3-triethoxysilylpropyl)tetrasulfane, methyltrimethoxysilane, methyltriethoxysilane, vinyltrimethoxysilane, vinyltriacetoxysilane, imidazolesilane, and the like.

The resin layer-forming composition (IV-1) and the curable resin layer may contain one or two or more types of the coupling agents (E), and, in a case in which the resin layer-forming composition and the curable resin layer contain two or more types of the coupling agents, the combination and ratio thereof can be arbitrarily selected.

In a case in which the coupling agent (E) is used, in the resin layer-forming composition (IV-1) and the curable resin layer, the content of the coupling agent (E) is preferably 0.03 to 20 parts by mass, more preferably 0.05 to 10 parts by mass, and particularly preferably 0.1 to 5 parts by mass of the total content (100 parts by mass) of the energy ray-curable component (a), the polymer component (A), and the thermosetting component (B). When the content of the coupling agent (E) is equal to or more than the lower limit value, the effects of the use of the coupling agent (E) such as the improvement of the dispersibility of the filler (D) in resins and the improvement of the adhesiveness of the curable resin layer to adherends can be significantly obtained.

In addition, when the content of the coupling agent (E) is equal to or less than the upper limit value, the generation of outgas is further suppressed.

[Crosslinking Agent (F)]

In a case in which as the energy ray-curable component (a), an energy ray-curable component such as the above-described acrylic resin, having a functional group such as a vinyl group, a (meth)acryloyl group, an amino group, a hydroxyl group, a carboxy group, or an isocyanate group which is capable of reacting with other compounds is used, the resin layer-forming composition (IV-1) and the curable resin layer may also contain a crosslinking agent (F) for bonding and crosslinking the functional group to other compounds. When the functional group is crosslinked to other compounds using the crosslinking agent (F), it is possible to adjust the initial adhesiveness and the agglomerative force of the curable resin layer.

Examples of the crosslinking agent (F) include organic polyhydric isocyanate compounds, organic polyhydric imine compounds, metal chelate-based crosslinking agents (crosslinking agents having a metal chelate structure), aziridine-based crosslinking agents (crosslinking agents having an aziridinyl group), and the like.

Examples of the organic polyhydric isocyanate compounds include aromatic polyhydric isocyanate compounds, aliphatic polyhydric isocyanate compounds, and alicyclic polyhydric isocyanate compounds (hereinafter, in some cases, these compounds will be collectively abbreviated as "aromatic polyhydric isocyanate compounds and the like"); timers, isocyanurate bodies, and adduct bodies of the aromatic polyhydric isocyanate compounds and the like; terminal isocyanate urethane prepolymers obtained by reacting the aromatic polyhydric isocyanate compounds and the like and a polyol compound. The "adduct body" refers to a reactant of the aromatic polyhydric isocyanate compound, the aliphatic polyhydric isocyanate compound, or the alicyclic polyhydric isocyanate compound and a low-molecular-weight active hydrogen-containing compound such as ethylene glycol, propylene glycol, neopentyl glycol, trimethylolpropane, or castor oil, and examples thereof include xylylene diisocyanate adducts of trimethylolpropane as described below and the like. In addition, "the terminal isocyanate urethane prepolymer" is as described above.

More specific examples of the organic polyhydric isocyanate compound include 2,4-tolylene diisocyanate; 2,6-tolylene diisocyanate; 1,3-xylylene diisocyanate; 1,4-xylylene diisocyanate; diphenylmethane-4,4'-diisocyanate; diphenylmethane-2,4'-diisocyanate; 3-methyldiphenylmethane diisocyanate; hexamethylene diisocyanate; isophorone diisocyanate; dicyclohexylmethane-4,4'-diisocyanate; dicyclohexylmethane-2,4'-diisocyanate; compounds obtained by adding any one or two or more types of tolylene diisocyanate, hexamethylene diisocyanate, and xylylene diisocyanate to all or some of hydroxyl groups in a polyol such as trimethylolpropane; lysine diisocyanate; and the like.

Examples of the organic polyhydric imine compounds include N,N'-diphenylmethane-4,4'-bis(1-aziridinecarboxamide), trimethylolpropane tri-β-aziridinylpropionate, tetramethylolmethane-tri-β-aziridinylpropionate, N,N'-toluene-2,4-bis(1-aziridinecarboxamido)triethylene melamine, and the like.

In a case in which the organic polyhydric isocyanate compound is used as the crosslinking agent (F), a hydroxyl group-containing polymer is preferably used as the polymer component (A). In a case in which the crosslinking agent (F) has an isocyanate group and the polymer component (A) has a hydroxyl group, it is possible to simply introduce a crosslinking structure into the curable resin layer by a reaction between the crosslinking agent (F) and the polymer component (A).

The resin layer-forming composition (IV-1) and the curable resin layer may contain one or two or more types of the crosslinking agents (F), and, in a case in which the resin layer-forming composition and the curable resin layer contain two or more types of the crosslinking agents, the combination and ratio thereof can be arbitrarily selected.

In a case in which the crosslinking agent (F) is used, in the resin layer-forming composition (IV-1), the content of the crosslinking agent (F) is preferably 0.01 to 20 parts by mass, more preferably 0.1 to 10 parts by mass, and particularly preferably 0.5 to 5 parts by mass of the content (100 parts by mass) of the energy ray-curable component (a). When the content of the crosslinking agent (F) is equal to or more than the lower limit value, the effects of the use of the crosslinking agent (F) can be significantly obtained. In addition, when the content of the crosslinking agent (F) is equal to or less than the upper limit value, the excess use of the crosslinking agent (F) is suppressed.

[Versatile Additive (I)]

The resin layer-forming composition (IV-1) and the curable resin layer may also contain a versatile additive (I) as long as the effects of the present invention are not impaired.

The versatile additive (I) may be a well-known versatile additive, can be arbitrarily selected depending on the purpose, and is not particularly limited, and examples of preferred versatile additives include a plasticizer, an antistatic agent, an antioxidant, a coloring agent (a pigment or a dye), a gettering agent, and the like.

The resin layer-forming composition (IV-1) and the curable resin layer may contain one or two or more types of the versatile additives (I), and, in a case in which the resin layer-forming composition and the curable resin layer contain two or more types of the versatile additives, the combination and ratio thereof can be arbitrarily selected.

The content of the versatile additive (I) in the resin layer-forming composition (IV-1) and the curable resin layer is not particularly limited and may be appropriately selected depending on the purpose.

[Solvent]

The resin layer-forming composition (IV-1) preferably further contains a solvent. The resin layer-forming composition (IV-1) containing a solvent improves in terms of the handling property.

The solvent is not particularly limited, but preferred examples thereof include hydrocarbons such as toluene and xylyene; alcohols such as methanol, ethanol, 2-propanol, isobutyl alcohol (2-methyl propane-1-ol), and 1-butanol; esters such as ethyl acetate; ketones such as acetone and methyl ethyl ketone; ethers such as tetrahydrofuran; amides (compounds having an amide bond) such as dimethylformamide and N-methyl pyrrolidone, and the like.

The resin layer-forming composition (IV-1) may contain one or two or more types of the solvents, and, in a case in which the first pressure-sensitive adhesive composition contains two or more types of the solvents, the combination and ratio thereof can be arbitrarily selected.

The solvent contained in the resin layer-forming composition (IV-1) is preferably methyl ethyl ketone or the like since it is possible to more uniformly mix the components contained in the resin layer-forming composition (IV-1).

In the resin layer-forming composition (IV-1), one type of each of the thermosetting component, the photopolymerization initiator, the filler, the coupling agent, the crosslinking agent, and the versatile additive may be used singly or two or more types thereof may be jointly used, and, in a case in which two or more types thereof are used, the combination and ratio thereof can be arbitrarily selected.

The contents of the thermosetting component, the photopolymerization initiator, the filler, the coupling agent, the crosslinking agent, and the versatile additive in the resin layer-forming composition (IV-1) may be appropriately adjusted depending on the purpose and are not particularly limited.

The resin layer-forming composition (IV-1) preferably further contains a solvent since the resin layer-forming composition improves in terms of the handling property by dilution.

The resin layer-forming composition (IV-1) may contain one or two or more types of the solvents.

<<Thermosetting Resin Layer-Forming Composition>>

The thermosetting resin layer can be formed using a thermosetting resin layer-forming composition containing a constituent material thereof. For example, the thermosetting resin layer can be formed at an intended portion by applying the thermosetting resin layer-forming composition to a target surface on which the thermosetting resin layer is to be formed and drying the thermosetting resin layer-forming composition as necessary. The ratio between the contents of components, which do not gasify at normal temperature, in the thermosetting resin layer-forming composition is, generally, identical to the ratio between the contents of the above-described components in the thermosetting resin layer. Here, "normal temperature" is as described above.

The thermosetting resin layer-forming composition may be applied using a well-known method, and examples thereof include methods in which a variety of coaters such as an air knife coater, a blade coater, a bar coater, a gravure coater, a roll coater, a roll knife coater, a curtain coater, a die coater, a knife coater, a screen coater, a Mayer bar coater, and a kiss coater are used.

The drying conditions of the thermosetting resin layer-forming composition are not particularly limited, but the thermosetting resin layer-forming composition is preferably heated and dried, and, in this case, the thermosetting resin layer-forming composition is preferably dried under conditions of, for example, 70° C. to 130° C. for one to five minutes.

<Thermosetting Resin Layer-Forming Composition (III-1)>

Examples of the thermosetting resin layer-forming composition include a thermosetting resin layer-forming composition (III-1) containing the polymer component (A) and the thermosetting component (B) (in the present specification, in some cases, simply abbreviated as "the resin layer-forming composition (III-1)") and the like.

[Polymer Component (A)]

The polymer component (A) is a polymer compound for imparting a film-forming property, flexibility, and the like to the thermosetting resin layer.

The resin layer-forming composition (III-1) and the thermosetting resin layer may contain one or two or more types of the polymer components (A), and, in a case in which the resin layer-forming composition and the thermosetting resin layer contain two or more types of the polymer components, the combination and ratio thereof can be arbitrarily selected.

Examples of the polymer component (A) include acrylic resins (resins having a (meth)acryloyl group), polyesters, urethane-based resins (resins having a urethane bond), acrylic urethane resins, silicone-based resins (resin having a siloxane bond), rubber-based resins (resins having a rubber structure), phenoxy resins, thermosetting polyimides, and the like, and acrylic resins are preferred.

Examples of the acrylic resin in the polymer component (A) include well-known acrylic polymers.

The weight-average molecular weight (Mw) of the acrylic resin is preferably 10,000 to 2,000,000 and more preferably 100,000 to 1,500,000. When the weight-average molecular weight of the acrylic resin is equal to or more than the lower limit value, the shape stability (aging stability during storage) of the thermosetting resin layer improves. In addition, when the weight-average molecular weight of the acrylic resin is equal to or less than the upper limit value, it becomes easy for the thermosetting resin layer to follow the uneven surfaces of adherends, and the generation of voids and the like between an adherend and the thermosetting resin layer is further suppressed.

The glass transition temperature (Tg) of the acrylic resin is preferably $-60°$ C. to $70°$ C. and more preferably $-30°$ C. to $50°$ C. When the Tg of the acrylic resin is equal to or higher than the lower limit value, the adhesive force between the first protective film and the first supporting sheet (the pressure-sensitive adhesive layer) is suppressed, and thus the peeling property of the first supporting sheet (the pressure-sensitive adhesive layer) improves. In addition, when the Tg of the acrylic resin is equal to or lower than the upper limit value, the adhesive force of the thermosetting resin layer and the first protective film to adherends improves.

In the present specification, "the glass transition temperature" is represented by the temperature at the inflection point in a DSC curve of a specimen obtained using a differential scanning calorimeter.

Examples of the acrylic resin include polymers of one or two or more type of (meth)acrylic acid esters; copolymers of two or more types of monomers selected from (meth)acrylic acid, itaconic acid, vinyl acetate, acrylonitrile, styrene, N-methylol acrylamide, and the like; and the like.

Examples of the (meth)acrylic acid esters constituting the acrylic resin include alkyl (meth)acrylates in which an alkyl group constituting the alkyl ester has 1 to 18 carbon atoms and has a chain-like shape such as methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, tert-butyl (meth)acrylate, pentyl (meth)acrylate, hexyl (meth)acrylate, heptyl (meth) acrylate, 2-ethylhexyl (meth)acrylate, isooctyl (meth)acrylate, n-octyl (meth)acrylate, n-nonyl (meth)acrylate, isononyl (meth)acrylate, decyl (meth)acrylate, undecyl (meth)acrylate, dodecyl (meth)acrylate (also referred to as lauryl (meth)acrylate), tridecyl (meth)acrylate, tetradecyl (meth)acrylate (also referred to as myristyl (meth)acrylate), pentadecyl (meth)acrylate, hexadecyl (meth)acrylate (also referred to as palmityl (meth)acrylate), heptadecyl (meth) acrylate, and octadecyl (meth)acrylate (also referred to as stearyl (meth)acrylate) and the like;

cycloalkyl (meth)acrylates such as isobornyl (meth)acrylate and dicyclopentanyl (meth)acrylate;

aralkyl (meth)acrylates such as benzyl (meth)acrylate;

cycloalkenyl (meth)acrylates such as dicyclopentenyl (meth)acrylate;

cycloalkenyloxyalkyl (meth)acrylate such as dicyclopentenyloxyethyl (meth)acrylate;

imide (meth)acrylate;

glycidyl group-containing (meth)acrylic acid esters such as glycidyl (meth)acrylate;

hydroxyl group-containing (meth)acrylic acid esters such as hydroxymethyl (meth)acrylate, 2-hydroxyethyl (meth) acrylate, 2-hydroxypropyl (meth)acrylate, 3-hydroxypropyl (meth)acrylate, 2-hydorybutyl (meth)acrylate, 3-hydroxybutyl (meth)acrylate, and 4-hydroxybutyl (meth)acrylate;

substituted amino group-containing (meth)acrylic acid esters such as N-methylaminoethyl (meth)acrylate; and the like. Here, "the substituted amino group" refers to a group formed by substituting one or two hydrogen atoms in an amino group with a group other than a hydrogen atom.

The acrylic resin may be, for example, in addition to the (meth)acrylic acid ester, a resin formed by the copolymerization of one or two or more types of monomers selected from (meth)acrylic acid, itaconic acid, vinyl acetate, acrylonitrile, styrene, N-methylol acrylamide, and the like.

The acrylic resin may be constituted of one or two or more types of monomers, and, in a case in which the acrylic resin is constituted of two or more types of monomers, the combination and ratio thereof can be arbitrarily selected.

The acrylic resin may also have a functional group capable of reacting with other compounds such as a vinyl group, a (meth)acryloyl group, an amino group, a hydroxyl group, a carboxy group, or an isocyanate group. The functional group in the acrylic resin may be bonded to other compounds through a crosslinking agent (F) described below or may be directly bonded to other compounds without the crosslinking agent (F). When the acrylic resin is bonded to other compounds through the functional group, there is a tendency that the reliability of packages obtained using the first protective film-forming sheet improves.

In the present invention, as the polymer component (A), a thermoplastic resin other than the acrylic resin (hereinafter, in some cases, simply abbreviated as "the thermoplastic resin") may be used singly without using the acrylic resin or may be jointly used with the acrylic resin. When the thermoplastic resin is used, there are cases in which the peeling property of the first protective film from the first supporting sheet (the pressure-sensitive adhesive layer) improves, it becomes easy for the thermosetting resin layer to follow the uneven surfaces of adherends, and the generation of voids and the like between an adherend and the thermosetting resin layer is further suppressed.

The weight-average molecular weight of the thermoplastic resin is preferably 1,000 to 100,000 and more preferably 3,000 to 80,000.

The glass transition temperature (Tg) of the thermoplastic resin is preferably $-30°$ C. to $150°$ C. and more preferably $-20°$ C. to $120°$ C.

Examples of the thermoplastic resin include polyesters, polyurethanes, phenoxy resins, polybutene, polybutadienes, polystyrenes, and the like.

The resin layer-forming composition (III-1) and the thermosetting resin layer may contain one or two or more types of the thermoplastic resins, and, in a case in which the resin layer-forming composition and the thermosetting resin layer contain two or more types of the thermoplastic resins, the combination and ratio thereof can be arbitrarily selected.

In the resin layer-forming composition (III-1), the ratio of the content of the polymer component (A) (that is, the content of the polymer component (A) in the thermosetting resin layer) to the total content of all of the components other than the solvent is preferably 5% to 85% by mass and more preferably 5% to 80% by mass regardless of the type of the polymer component (A).

There are cases in which the polymer component (A) corresponds to the thermosetting component (B). In the present invention, in a case in which the resin layer-forming composition (III-1) contains components corresponding to both the polymer component (A) and the thermosetting component (B) as described above, the resin layer-forming composition (III-1) is considered to contain the polymer component (A) and the thermosetting component (B).

[Thermosetting Component (B)]

The resin layer-forming composition (III-1) and the thermosetting resin layer contain the thermosetting component (B). When the thermosetting resin layer contains the thermosetting component (B), the thermosetting component (B) cures the thermosetting resin layer by heating and thus forms a hard first protective film.

The resin layer-forming composition (IV-1) and the thermosetting resin layer may contain one or two or more types of the thermosetting components (B), and, in a case in which the resin layer-forming composition and the thermosetting resin layer contain two or more types of the thermosetting components, the combination and ratio thereof can be arbitrarily selected.

Examples of the thermosetting component (B) include epoxy-based thermosetting resins, thermosetting polyimides, polyurethanes, unsaturated polyesters, silicone resins, and the like, and epoxy-based thermosetting resins are preferred.

(Epoxy-Based Thermosetting Resin)

The epoxy-based thermosetting resin is made up of an epoxy resin (B1) and a thermal curing agent (B2).

The resin layer-forming composition (III-1) and the thermosetting resin layer may contain one or two or more types of the epoxy-based thermosetting resins, and, in a case in which the resin layer-forming composition and the thermosetting resin layer contain two or more types of the epoxy-based thermosetting resins, the combination and ratio thereof can be arbitrarily selected.

• Epoxy Resin (B1)

As the epoxy resin (B1), well-known epoxy resins can be exemplified. Examples thereof include di- or higher-functional epoxy compounds such as polyfunctional epoxy resins, biphenyl compounds, bisphenol A diglycidyl ethers and hydrogenated substances thereof, orthocresol novolac epoxy resins, dicyclopentadiene-type epoxy resins, biphenyl-type epoxy resins, bisphenol A-type epoxy resins, bisphenol F-type epoxy resins, phenylene skeleton-type epoxy resins, and the like, and, among these, polyfunctional epoxy resins, dicyclopentadiene-type epoxy resins, bisphenol F-type epoxy resins, and the like are preferred.

As the epoxy resin (B1), an epoxy resin having an unsaturated hydrocarbon group may also be used. The epoxy resin having an unsaturated hydrocarbon group has more favorable compatibility with acrylic resins than epoxy resins not having an unsaturated hydrocarbon group. Therefore, when the epoxy resin having an unsaturated hydrocarbon group is used, the reliability of packages obtained using the first protective film-forming sheet improves.

Examples of the epoxy resin having an unsaturated hydrocarbon group include compounds formed by converting a part of epoxy groups in a polyfunctional epoxy resin to groups having an unsaturated hydrocarbon group. The above-described compound can be obtained by, for example, an addition reaction of (meth)acrylic acid or a derivative thereof to an epoxy group.

In addition, examples of the epoxy resin having an unsaturated hydrocarbon group include compounds in which a group having an unsaturated hydrocarbon group is directly bonded to an aromatic ring or the like constituting an epoxy resin and the like.

The unsaturated hydrocarbon group is a polymerizable unsaturated group, and specific examples thereof include ethenyl groups (vinyl groups), 2-propenyl group (allyl group), (meth)acryloyl groups, (meth)acrylamide groups, and the like, and acryloyl groups are preferred.

The number-average molecular weight of the epoxy resin (B1) is not particularly limited, but is preferably 300 to 30,000, more preferably 400 to 10,000, and particularly preferably 500 to 3,000 from the viewpoint of the curing property of the thermosetting resin layer and the strength and thermal resistance of the first protective film after curing.

In the present specification, unless particularly otherwise described, "the number-average molecular weight" refers to a number-average molecular weight represented by a standard polystyrene-equivalent value measured using gel permeation chromatography (GPC).

The epoxy equivalent of the epoxy resin (B1) is preferably 100 to 1,000 g/eq and more preferably 300 to 800 g/eq.

In the present specification, "the epoxy equivalent" refers to the number of grams (g/eq) of an epoxy compound including one gram equivalent of epoxy group and can be measured according to the method of JIS K 7236:2001.

One type of the epoxy resin (B1) may be used singly or two or more types thereof may be jointly used, and, in a case in which two or more types thereof are jointly used, the combination and ratio thereof can be arbitrarily selected.

• Thermal Curing Agent (B2)

The thermal curing agent (B2) functions as a curing agent of the epoxy resin (B1).

Examples of the thermal curing agent (B2) include compounds having two or more functional groups capable of reacting with an epoxy group in one molecule. Examples of the functional group include phenolic hydroxyl groups, alcoholic hydroxyl groups, an amino group, a carboxy group, groups in which an acid group is turned into an anhydride, and the like, phenolic hydroxyl groups, amino groups, or groups in which an acid group is turned into an anhydride are preferred, and phenolic hydroxyl groups or amino groups are more preferred.

As the thermal curing agent (B2), examples of phenolic curing agents having a phenolic hydroxyl group include polyfunctional phenolic resins, biphenol, novolac-type phenol resins, dicyclopentadiene-based phenolic resins, aralkylphenol resins, and the like.

As the thermal curing agent (B2), examples of amine-based curing agents having an amino group include dicyandiamide (hereinafter, in some cases, abbreviated as "DICY"), and the like.

The thermal curing agent (B2) may also have an unsaturated hydrocarbon group.

Examples of the thermal curing agent (B2) having an unsaturated hydrocarbon group include compounds formed by substituting a part of hydroxyl groups in a phenolic resin with groups having an unsaturated hydrocarbon group, compounds formed by directly bonding a group having an unsaturated hydrocarbon group to an aromatic ring of a phenolic resin, and the like.

The unsaturated hydrocarbon group in the thermal curing agent (B2) is identical to the unsaturated hydrocarbon group in the above-described epoxy resin having an unsaturated hydrocarbon group.

In a case in which a phenolic curing agent is used as the thermal curing agent (B2), the thermal curing agent (B2)

preferably has a high softening point or glass transition temperature since the peeling property of the first protective film from the first pressure-sensitive adhesive layer improves.

The number-average molecular weight of the resin component such as a polyfunctional phenolic resin, a novolac-type phenolic resin, a dicyclopentadiene-based phenolic resin, or an aralkylphenol resin as the thermal curing agent (B2) is preferably 300 to 30,000, more preferably 400 to 10,000, and particularly preferably 500 to 3,000.

The molecular weight of a non-resin component, for example, biphenol or dicyandiamide as the thermal curing agent (B2) is not particularly limited, and is preferably, for example, 60 to 500.

The thermal curing agent (B2) is preferably, for example, a novolac-type phenolic resin.

One type of the thermal curing agent (B2) may be used singly or two or more types thereof may be jointly used, and, in a case in which two or more types thereof are jointly used, the combination and ratio thereof can be arbitrarily selected.

In the resin layer-forming composition (III-1) and the thermosetting resin layer, the content of the thermal curing agent (B2) is preferably 0.1 to 500 parts by mass and more preferably 1 to 200 parts by mass of the content (100 parts by mass) of the epoxy resin (B1). When the content of the thermal curing agent (B2) is equal to or more than the lower limit value, it becomes easier for the curing of the thermosetting resin layer to proceed. In addition, when the content of the thermal curing agent (B2) is equal to or less than the upper limit value, the absorptivity of the thermosetting resin layer decreases, and thus the reliability of packages obtained using the first protective film-forming sheet further improves.

In the resin layer-forming composition (III-1) and the thermosetting resin layer, the content of the thermosetting component (B) (for example, the total content of the epoxy resin (B1) and the thermal curing agent (B2) is preferably 50 to 1,000 parts by mass, more preferably 100 to 900 parts by mass, and particularly preferably 150 to 800 parts by mass of the content (100 parts by mass) of the polymer component (A). When the content of the thermosetting component (B) is in the above-described range, the adhesive force between the first protective film and the first pressure-sensitive adhesive layer is suppressed, and thus the peeling property of the first pressure-sensitive adhesive layer improves.

[Energy Ray-Curable Resin (G)]

The resin layer-forming composition (III-1) and the thermosetting resin layer may also contain an energy ray-curable resin (G). When the thermosetting resin layer contains the energy ray-curable resin (G), the energy ray-curable resin serves as a component for forming the first protective film by curing the thermosetting resin layer by irradiation with energy rays.

The energy ray-curable resin (G) is obtained by polymerizing (curing) an energy ray-curable compound.

Examples of the energy ray-curable compound include compounds having at least one polymerizable double bond in the molecule, and acrylate-based compounds having a (meth)acryloyl group are preferred.

Examples of the acrylate-based compounds include chain-like aliphatic skeleton-containing (meth)acrylates such as trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxy penta(meth)acrylate, dipentaerythritol hexa(meth)acrylate, 1,4-butylene glycol di(meth)acrylate, and 1,6-hexanediol di(meth)acrylate; polyalkylene glycol (meth) acrylates such as polyethylene glycol di(meth)acrylate; oligo ester (meth)acrylates; urethane (meth)acrylate oligomers; epoxy-modified (meth)acrylates; polyether (meth)acrylates other than the above-described polyalkylene glycol (meth)acrylates; itaconic acid oligomers; and the like.

The weight-average molecular weight of the energy ray-curable compound is preferably 100 to 30,000 and more preferably 300 to 10,000.

One or two or more types of the energy ray-curable compounds may be used for polymerization, and, in a case in which two or more types of the energy ray-curable compounds are used, the combination and ratio thereof can be arbitrarily selected.

The resin layer-forming composition (III-1) may contain one or two or more types of the energy ray-curable resins (G), and, in a case in which the resin layer-forming composition contains two or more types of the energy ray-curable resins, the combination and ratio thereof can be arbitrarily selected.

In the resin layer-forming composition (III-1), the content of the energy ray-curable resin (G) is preferably 1 to 95% by mass, more preferably 5 to 90% by mass, and particularly preferably 10 to 85% by mass of the total mass of the resin layer-forming composition (III-1).

[Curing Accelerator (C)]

The resin layer-forming composition (III-1) and the thermosetting resin layer may also contain a curing accelerator (C). The curing accelerator (C) is a component for adjusting the curing rate of the resin layer-forming composition (III-1).

Examples of preferred curing accelerators (C) include tertiary amines such as triethylene diamine, benzyldimethylamine, triethanolamine, dimethylaminoethanol, and tris(dimethylaminomethyl)phenol; imidazoles (imidazoles in which one or more hydrogen atoms are substituted with groups other than a hydrogen atom) such as 2-methylimidazole, 2-phenylimidazole, 2-phenyl-4-methylimidazole, 2-phenyl-4,5-dihydroxymethylimidazole, and 2-phenyl-4-methyl-5-hydroxymethylimidazole; organic phosphines (phosphines in which one or more hydrogen atoms are substituted with organic groups) such as tributyl phosphine, diphenyl phosphine, and triphenyl phosphine; tetraphenyl boron salts such as tetraphenylphosphonium tetraphenyl borate and triphenylphosphine tetraphenyl borate; and the like, and, among these, 2-phenyl-4,5-dihydroxymethylimidazole and the like are preferred.

The resin layer-forming composition (III-1) and the thermosetting resin layer may contain one or two or more types of the curing accelerators (C), and, in a case in which the resin layer-forming composition and the thermosetting resin layer contain two or more types of the curing accelerators, the combination and ratio thereof can be arbitrarily selected.

In a case in which the curing accelerator (C) is used, in the resin layer-forming composition (III-1) and the thermosetting resin layer, the content of the curing accelerator (C) is preferably 0.01 to 10 parts by mass and more preferably 0.1 to 5 parts by mass of the content (100 parts by mass) of the thermosetting component (B). When the content of the curing accelerator (C) is equal to or more than the lower limit value, the effects of the use of the curing accelerator (C) can be more significantly obtained, and, when the content of the curing accelerator (C) is equal to or less than the upper limit value, for example, an effect of suppressing a highly polar curing accelerator (C) migrating toward the adhesion interface with adherends in the thermosetting resin layer under high temperature and high humidity conditions and segregating becomes significant, and the reliability of packages obtained using the first protective film-forming sheet further improves.

[Filler (D)]

The resin layer-forming composition (III-1) and the thermosetting resin layer may also contain a filler (D). When the content of the filler (D) in the curable resin layer is adjusted, it is possible to adjust the wetting and spreading property of the curable resin layer. That is, it is possible to decrease the wetting and spreading property by increasing the content of the filler (D), and it is possible to increase the wetting and spreading property by decreasing the content of the filler (D). In addition, when the thermosetting resin layer contains the filler (D), the adjustment of the thermal expansion coefficient of the first protective film obtained by curing the thermosetting resin layer becomes easy, and, when this thermal expansion coefficient is optimized for a subject on which the first protective film is to be formed, the reliability of packages obtained using the first protective film-forming sheet further improves. In addition, when the curable resin layer contains the filler (D), it is also possible to decrease the moisture absorptivity of the first protective film.

The description of the filler (D) contained in the resin layer-forming composition (III-1) and the thermosetting resin layer is identical to the description of the filler (D) contained in the resin layer-forming composition (IV-1).

[Coupling Agent (E)]

The resin layer-forming composition (III-1) and the thermosetting resin layer may also contain a coupling agent (E). When a coupling agent having a functional group capable of reacting with an inorganic compound or an organic compound is used as the coupling agent (E), it is possible to improve the adhesiveness and adhesion of the thermosetting resin layer to adherends. In addition, when the coupling agent (E) is used, the first protective film obtained by curing the thermosetting resin layer is not impaired in the thermal resistance and is improved in terms of the water resistance.

The description of the coupling agent (E) contained in the resin layer-forming composition (III-1) and the thermosetting resin layer is identical to the description of the coupling agent (E) contained in the resin layer-forming composition (IV-1).

[Crosslinking Agent (F)]

In a case in which as the polymer component (A), a polymer component such as the above-described acrylic resin, having a functional group such as a vinyl group, a (meth)acryloyl group, an amino group, a hydroxyl group, a carboxy group, or an isocyanate group which is capable of reacting with other compounds is used, the resin layer-forming composition (III-1) and the thermosetting resin layer may also contain a crosslinking agent (F) for bonding and crosslinking the functional group to other compounds. When the functional group is crosslinked to other compounds using the crosslinking agent (F), it is possible to adjust the initial adhesiveness and the agglomerative force of the thermosetting resin layer.

The description of the crosslinking agent (F) contained in the resin layer-forming composition (III-1) and the thermosetting resin layer is identical to the description of the crosslinking agent (F) contained in the resin layer-forming composition (IV-1).

[Photopolymerization Initiator (H)]

In the case of containing the energy ray-curable resin (G), the resin layer-forming composition (III-1) and the thermosetting resin layer may also contain a photopolymerization initiator (H) in order to conduct the polymerization reaction of the energy ray curable resin (G) to more efficiently proceed.

Examples of the photopolymerization initiator (H) in the resin layer-forming composition (III-1) and the thermosetting resin layer include the same photopolymerization initiators as those in the first pressure-sensitive adhesive composition (I-1).

[Versatile Additive (I)]

The resin layer-forming composition (III-1) and the thermosetting resin layer may also contain a versatile additive (I) as long as the effects of the present invention are not impaired.

The description of the versatile additive (I) contained in the resin layer-forming composition (III-1) and the thermosetting resin layer is identical to the description of the versatile additive (I) contained in the resin layer-forming composition (IV-1).

[Solvent]

The resin layer-forming composition (III-1) preferably further contains a solvent. The resin layer-forming composition (III-1) containing a solvent improves in terms of the handling property.

The description of the solvent contained in the resin layer-forming composition (III-1) is identical to the description of the solvent contained in the resin layer-forming composition (IV-1).

In an aspect of the present invention, the first protective film-forming sheet of the present invention has a curable resin layer containing, as the polymer component (A), an acrylic resin (90 to 110 parts by mass and preferably 100 parts by mass) obtained by copolymerizing butyl acrylate (50 to 60 parts by mass and preferably 55 parts by mass), methyl acrylate (8 to 12 parts by mass and preferably 10 parts by mass), glycidyl methacrylate (18 to 22 parts by mass and preferably 20 parts by mass), and 2-hydroxyethyl acrylate (13 to 17 parts by mass and preferably 15 parts by mass); as the thermosetting component (B), a bisphenol F-type epoxy resin (120 to 150 parts by mass and preferably 135 parts by mass), a polyfunctional aromatic epoxy resin (80 to 100 parts by mass and preferably 90 parts by mass), and a dicyclopentadiene-type epoxy resin (135 to 165 parts by mass and preferably 150 parts by mass); as the thermal curing agent (B2), a novolac-type phenolic resin (160 to 200 parts by mass and preferably 180 parts by mass); as the curing accelerator (C), 2-phenyl-4,5-dihydroxymethylimidazole (0.9 to 1.1 parts by mass and preferably 1 part by mass); and, as the filler (D), spherical silica modified with an epoxy group (average particle diameter: 50 nm) (140 to 600 parts by mass and preferably 160 to 540 parts by mass).

<<Method for Manufacturing Curable Resin Layer-Forming Composition>>

The curable resin layer-forming compositions such as the thermosetting resin layer-forming composition (III-1) and the energy ray-curable resin layer-forming composition (IV-1) can be obtained by blending individual components for constituting the composition.

The addition order during the blending of the respective components is not particularly limited, and two or more types of components may be added at the same time.

In a case in which the solvent is used, the solvent may be used by mixing the solvent with all of the blending components other than the solvent so as to dilute these blending components in advance or may be used by mixing the solvent with the blending components without diluting all of the blending components other than the solvent in advance.

A method for mixing the respective components during blending is not particularly limited and may be appropriately selected from well-known methods such as a method in which the components are mixed together by rotating a stirring stick, a stirring blade, or the like; a method in which the components are mixed together using a mixer, and a method in which the components are mixed together by applying ultrasonic waves thereto.

The temperature and the time during the addition and mixing of the respective components are not particularly limited as long as the respective blending components do not deteriorate and may be appropriately adjusted, but the temperature is preferably 15° C. to 30° C.

Method for Manufacturing First Protective Film-Forming Sheet

The first protective film-forming sheet can be manufactured by sequentially stacking the respective layers described above so as to obtain the corresponding positional relationship. The methods for forming the respective layers are as described above.

For example, in the manufacturing of the first protective film-forming sheet, in a case in which the first pressure-sensitive adhesive layer or the first interlayer is stacked on the first base material, the first pressure-sensitive adhesive layer or the first interlayer can be stacked by applying the first pressure-sensitive adhesive composition or the first interlayer-forming composition described above onto the first base material and drying the composition or irradiating the composition with energy rays as necessary.

Meanwhile, for example, in a case in which the curable resin layer is further stacked on the first pressure-sensitive adhesive layer that has been stacked on the first base material, the curable resin layer can be directly formed by applying the curable resin layer-forming composition onto the first pressure-sensitive adhesive layer. Similarly, in a case in which the first pressure-sensitive adhesive layer is further stacked on the first interlayer that has been stacked on the first base material, the first pressure-sensitive adhesive layer can be directly formed by applying the first pressure-sensitive adhesive composition onto the first interlayer. As described above, in a case in which a stacking structure of two continuous layers is formed using any compositions, it is possible to newly form a layer by further applying the composition onto a layer formed of the above-described composition. Here, the stacking structure of two continuous layers is preferably formed by forming, between these two layers, the layer which is stacked from the back on a separate peeling film in advance using the above-described composition and attaching the exposed surface opposite to the surface of the already-formed layer in contact with the peeling film to the exposed surface of the other layer that has been formed. At this time, the above-described composition is preferably applied onto a peeling-treated surface of the peeling film. The peeling film may be removed as necessary after the formation of the stacking structure.

For example, in a case in which a first protective film-forming sheet (the first protective film-forming sheet which is a stacked substance of the first base material and the first pressure-sensitive adhesive layer) formed by stacking the first pressure-sensitive adhesive layer on the first base material and stacking the curable resin layer on the first pressure-sensitive adhesive layer is manufactured, the first protective film-forming sheet can be obtained by applying the first pressure-sensitive adhesive composition onto the first base material and drying the first pressure-sensitive adhesive composition as necessary so as to stack the first pressure-sensitive adhesive layer on the first base material, separately, applying the curable resin layer-forming composition onto the peeling film and drying the curable resin layer-forming composition as necessary so as to form the curable resin layer on the peeling film, and attaching the exposed surface of the curable resin layer to the exposed surface of the first pressure-sensitive adhesive layer that has been stacked on the first base material so as to stack the curable resin layer on the first pressure-sensitive adhesive layer.

In addition, for example, in a case in which a first protective film-forming sheet formed by stacking the first interlayer on the first base material and stacking the pressure-sensitive adhesive layer on the first interlayer is manufactured, the first protective film-forming sheet can be obtained by applying the first interlayer-forming composition onto the first base material and drying the first interlayer-forming composition or irradiating the first interlayer-forming composition with energy rays as necessary so as to stack the first interlayer on the first base material, separately, applying the first pressure-sensitive adhesive composition onto the peeling film and drying the first pressure-sensitive adhesive composition as necessary so as to form the first pressure-sensitive adhesive layer on the peeling film, and attaching the exposed surface of the first pressure-sensitive adhesive layer to the exposed surface of the first interlayer that has been stacked on the first base material so as to stack the first pressure-sensitive adhesive layer on the first interlayer. In this case, the first protective film-forming sheet can be obtained by, for example, separately, further applying the curable resin layer-forming composition onto the peeling film and drying the curable resin layer-forming composition as necessary so as to form the curable resin layer on the peeling film and attaching the exposed surface of the curable resin layer to the exposed surface of the first pressure-sensitive adhesive layer that has been stacked on the first interlayer so as to stack the curable resin layer on the first pressure-sensitive adhesive layer.

Meanwhile, in a case in which the first pressure-sensitive adhesive layer or the first interlayer is stacked on the first base material, as described above, the first pressure-sensitive adhesive layer or the first interlayer may be stacked on the first base material by, instead of applying the first pressure-sensitive adhesive composition or the first interlayer-forming composition onto the first base material, applying the first pressure-sensitive adhesive composition or the first interlayer-forming composition onto the peeling film and drying the composition or irradiating the composition with energy rays as necessary so as to form the first pressure-sensitive adhesive layer or the first interlayer on the peeling film and attaching the exposed surface of this layer to one surface of the first base material so as to stack the first pressure-sensitive adhesive layer or the first interlayer on the first base material.

In any of the methods, the peeling film may be removed at an arbitrary timing after the formation of the intended stacking structure.

As described above, all of the layers other than the first base material which constitute the first protective film-forming sheet can be stacked using a method in which the layers are formed on the peeling film in advance and attached on a surface of an intended layer, and thus the first protective film-forming sheet may be manufactured by appropriately selecting layers for which the above-described steps are employed as necessary.

Meanwhile, the first protective film-forming sheet is, generally, stored in a state in which the peeling film is attached to the surface of the outermost layer on the opposite side to the base material (for example, the curable resin layer). Therefore, the first protective film-forming sheet can also be obtained by applying a composition for forming a layer constituting the outermost layer such as the curable resin layer-forming composition onto the peeling film (preferably the peeling-treated surface thereof) and drying the curable resin layer-forming composition as necessary so as to form the layer constituting the outermost layer on the peeling film, stacking the remaining layers on the exposed surface on the opposite side to the surface of the layer in contact with the peeling film using any of the above-described methods, and leaving the layers in the attached state without removing the peeling film.

An aspect of the present invention is a first protective film-forming sheet formed by stacking the first pressure-sensitive adhesive layer on the first base material and stacking the curable resin layer on the first pressure-sensitive adhesive layer, in which the curable resin layer is a layer to form a first protective film on a bump-provided surface of a semiconductor wafer by being attached to the surface and cured, the sum of the thickness of the curable resin layer and the thickness of the first pressure-sensitive adhesive layer is 110 μm to 170 μm, the thickness of the curable resin layer is 60 μm to 100 μm, the wetting and spreading property of the curable resin layer at a temperature of 70° C., a load of 400 gf, and a retention time of five seconds is 150% to 180%, and the shear elastic modulus of the first pressure-sensitive adhesive layer is $1.0 \times 10^6$ Pa to $5.0 \times 10^6$ Pa.

<<Method for Manufacturing Semiconductor Chip>>

Regarding a method for forming the first protective film that protects a circuit surface of a semiconductor wafer having bumps formed on the circuit surface and the bumps using the first protective film-forming sheet of the present invention, the method described above can be applied.

A method for manufacturing a semiconductor chip is a method further including a step of dividing a semiconductor wafer on which the first protective film is formed by dicing the semiconductor wafer together with the first protective film.

The dicing can be carried out by dicing and dividing the semiconductor wafer together with the first protective film using a dicing blade that is ordinarily used in the corresponding technical field.

Ahead of the dicing step, a step of grinding the rear surface of the semiconductor wafer, that is, the surface opposite to the circuit surface on which the bumps are formed may also be provided. In addition, ahead of the dicing step, dicing tape or the like is preferably attached to the rear surface of the semiconductor wafer. As the dicing tape, a dicing tape attachment device, and a division technique, well-known tape, device, and technique can be applied.

EXAMPLES

Hereinafter, the present invention will be more specifically described using specific examples. However, the present invention is not limited to examples described below.

Components used to manufacture a thermosetting resin layer-forming composition will be described below.
• Polymer Components
Polymer component (A)-1: An acrylic resin (the weight-average molecular weight: 800,000, the glass transition temperature: −28° C.) obtained by copolymerizing butyl acrylate (hereinafter, abbreviated as "BA") (55 parts by mass), methyl acrylate (hereinafter, abbreviated as "MA") (10 parts by mass), glycidyl methacrylate (hereinafter, abbreviated as "GMA") (20 parts by mass), and 2-hydroxyethyl acrylate (hereinafter, abbreviated as "HEA") (15 parts by mass)
• Epoxy Resin
Epoxy resin (B1)-1: Liquid-form bisphenol F-type epoxy resin ("YL983U" manufactured by Mitsubishi Chemical Corporation)
Epoxy resin (B1)-2: Polyfunctional aromatic epoxy resin ("EPPN-502H" manufactured by Nippon Kayaku Co., Ltd.)
Epoxy resin (B1)-3: Dicyclopentadiene-type epoxy resin ("EPICLON HP-7200" manufactured by DIC Corporation)
• Thermal Curing Agent
Thermal curing agent (B2)-1: Novolac-type phenolic resin ("BRG-556" manufactured by Showa Denko K.K.)
• Curing Accelerator
Curing accelerator (C)-1: 2-Phenyl-4,5-dihydroxymethyl-imidazole ("CUREZOL 2PHZ-PW" manufactured by Shikoku Chemicals Corporation)
• Filler
Filler (D)-1: Spherical silica modified with an epoxy group (average particle diameter: 50 nm) ("ADMANANO YA050C-MKK" manufactured by Admatechs)

Manufacturing Example 1

(Manufacturing of Pressure-Sensitive Adhesive Resin (I-2a))
2-Ethylhexyl acrylate (hereinafter, abbreviated as "2EHA") (80 parts by mass) and HEA (20 parts by mass) were used as raw materials of a copolymer, and a polymerization reaction was conducted, thereby obtaining an acrylic polymer. The formulation of the respective components is shown in Table 1.

2-Methacryloyloxyethyl isocyanate (hereinafter, abbreviated as "MOI") (22 parts by mass, approximately 80 mol % of HEA) was added to this acrylic polymer, and an addition reaction was conducted in an air flow at 50° C. for 48 hours, thereby obtaining an intended pressure-sensitive adhesive resin (I-2a). The formulation of the respective components is shown in Table 1.

Example 1

<Manufacturing of First Protective Film-Forming Sheet>
(Manufacturing of Thermosetting Resin Layer-Forming Composition)
The polymer component (A)-1, the epoxy resin (B1)-1, the epoxy resin (B1)-2, the epoxy resin (B1)-3, the thermal curing agent (B2)-1, the curing accelerator (C)-1, and the filler (D)-1 were dissolved or dispersed in methyl ethyl ketone so that the ratios of the contents to the total content of all of the components other than the solvent reached values shown in Table 1 (shown as "ratio of content" in Table 1) and were stirred at 23° C., thereby obtaining a resin layer-forming composition (III-1) having a solid content concentration of 55% by mass as a thermosetting resin layer-forming composition. Meanwhile, the sign "-" in the column of the contained component in Table 1 indicates that the thermosetting resin layer-forming composition did not contain the corresponding components.

(Manufacturing of First Pressure-Sensitive Adhesive Composition)
A tolylene diisocyanate trimer adduct of trimethylolpropane ("CORONATE L" manufactured by Tosoh Corporation) (0.5 parts by mass) was added as an isocyanate-based crosslinking agent to the pressure-sensitive adhesive resin (I-2a) obtained in Manufacturing Example 1 (100 parts by mass) and was stirred at 23° C., thereby obtaining a first pressure-sensitive adhesive composition (I-2) having a solid content concentration of 30% by mass as a first pressure-sensitive adhesive composition. Meanwhile, the numbers of parts blended in the "manufacturing of the first pressure-sensitive adhesive composition" are all solid content-equivalent values.

(Manufacturing of First Protective Film-Forming Sheet)

The above-obtained first pressure-sensitive adhesive composition was applied onto a peeling-treated surface of a peeling film ("SP-PET381031" manufactured by Lintec Corporation, thickness: 38 μm) obtained by carrying out a peeling treatment on a single surface of a polyethylene terephthalate film with a silicone treatment and was heated and dried at 120° C. for two minutes, thereby forming a 60 μm-thick first pressure-sensitive adhesive layer.

Next, a 105 μm-thick stacked film formed by stacking a polyolefin film (thickness: 25 μm), an adhesive layer (thickness: 2.5 μm), a polyethylene terephthalate film (thickness: 50 μm), an adhesive layer (thickness: 2.5 μm), and a polyolefin film (thickness: 25 μm) in this order was attached as a first base material to an exposed surface of the first pressure-sensitive adhesive layer, thereby obtaining a first supporting sheet.

The above-obtained thermosetting resin layer-forming composition was applied to a peeling-treated surface of a peeling film ("SP-PET381031" manufactured by Lintec Corporation, thickness: 38 μm) obtained by carrying out a peeling treatment on a single surface of a polyethylene terephthalate film with a silicone treatment and was dried at 100° C. for two minutes, thereby producing a 80 μm-thick curable resin film (curable resin layer).

Next, the peeling film was removed from the first pressure-sensitive adhesive layer of the above-obtained first supporting sheet, an exposed surface of the above-obtained curable resin film was attached to an exposed surface of the first pressure-sensitive adhesive layer, thereby obtaining a first protective film-forming sheet formed by stacking the first base material, the first pressure-sensitive adhesive layer, the curable resin layer, and the peeling film in this order in the thickness direction.

Examples 2 to 5 and Comparative Examples 1 to 3

First protective film-forming sheets were manufactured in the same manner as in Example 1 except for the fact that the content of the filler (D)-1 in a curable resin layer-forming composition was adjusted to be as shown in Table 1 and the thickness of the adhesive layer and the thickness of a curable resin layer were adjusted to be as shown in Table 2, and the curable resin layers and first protective films were evaluated.

The results are shown in Table 2.

<Evaluation of Curable Resin Layer>

(Measurement of Wetting and Spreading Property)

A curable resin layer was manufactured using the above-obtained thermosetting resin layer-forming composition, and a sample was produced by cutting the manufactured curable resin layer to a round shape having a diameter of 1.5 mm. The sample was laminated on a glass slide, then, the sample was sandwiched between the glass slide and a five-square millimeter glass chip, a load of 400 gf was applied thereto while heating the sample at a temperature of 70° C. for five seconds using a bonding head, and the spread ratio to the initial value (the round shape having a diameter of 1.5 mm) set to 100% was calculated.

The results are shown in Table 2.

<Evaluation of First Protective Film>

(Confirmation of Gap Suppression Effect of First Protective Film)

(1) The following bump chip was prepared.

Chip thickness . . . 250 μm

Chip size . . . 6.0 mm×6.0 mm

Bump height . . . 200 μm

Bump pitch . . . 400 μm

Electrode . . . Solder bump SAC 305

(2) This bump chip was placed on a lamination device (RAD-3510F/12 (manufactured by Lintec Corporation)), the peeling film of the above-obtained first protective film-forming sheet was peeled off, and the curable resin layer was laminated on the bump chip under the following conditions.

Stage temperature . . . 70° C.

Stage height . . . −250 μm

Roller temperature . . . normal temperature

Roller pressure . . . 0.5 MPa

Roller rate . . . 2 mm/sec (3) After the lamination, the bump chip was removed and was irradiated with UV under conditions of 230 mW/cm$^2$ and 380 mJ/cm$^2$ in an RAD-2010m/12 after the temperature of the bump chip returned to normal temperature (after approximately five minutes).

(4) After the temperature of the bump chip returned to normal temperature, the first supporting sheet was peeled off from the bump chip.

(5) The bump chip protected with the first protective film was set in a sample table for a SEM measurement specimen so that the first protective film-attached surface faced upwards.

(6) The first protective film-attached bump chip was observed in a direction perpendicular to the first protective film using a SEM (VE-9700; manufactured by Keyence Corporation). The results are shown in Table 2.

A bump chip from which no gap was observed . . . A

A bump chip from which no large gap was observed, but voids were observed . . . B A bump chip from which a large gap was observed . . . C (Confirmation of Bump Apex Exposure Characteristic)

A bump chip protected with the first protective film was produced in the same manner as described above, and bump apexes were observed using the SEM (VE-9700; manufactured by Keyence Corporation) in the same manner as described above. The results are shown in Table 2.

A bump chip from which exposed portions of bumps were observed . . . A

A bump chip in which a thin residue through which the surface shapes of bumps were visible was observed on the bumps . . . B A bump chip in which a thick residue was observed on bumps . . . C <Evaluation of First Pressure-Sensitive Adhesive Layer>

(Measurement of Shear Elastic Modulus)

For the first pressure-sensitive adhesive layer, the shear elastic modulus was measured at a frequency of 1 Hz using a dynamic viscoelastic measurement instrument (ARES; manufactured by TA Instruments). The results are shown in Table 2.

TABLE 1

|  |  |  | Example 1 | Example 2 | Example 3 | Example 4 | Example 5 | Comparative Example 1 | Comparative Example 2 | Comparative Example 3 |
|---|---|---|---|---|---|---|---|---|---|---|
| Components contained in thermosetting resin layer-forming composition (ratio of contents (parts by mass)) | Polymer component | (A)-1 | 100 | 100 | 100 | 100 | 100 | 100 | 100 | 100 |
| | Epoxy resin | (B1)-1 | 135 | 135 | 135 | 135 | 135 | 135 | 135 | 135 |
| | | (B1)-2 | 90 | 90 | 90 | 90 | 90 | 90 | 90 | 90 |
| | | (B1)-3 | 150 | 150 | 150 | 150 | 150 | 150 | 150 | 150 |
| | Thermal curing agent | (B2)-1 | 180 | 180 | 180 | 180 | 180 | 180 | 180 | 180 |
| | Curing accelerator | (C)-1 | 1 | 1 | 1 | 1 | 1 | 1 | 1 | 1 |
| | Filler | (D)-1 | 160 | 160 | 160 | 160 | 540 | 160 | 160 | — |

TABLE 2

|  | Example 1 | Example 2 | Example 3 | Example 4 | Example 5 | Comparative Example 1 | Comparative Example 2 | Comparative Example 3 |
|---|---|---|---|---|---|---|---|---|
| Thickness of pressure-sensitive adhesive layer (μm) | 60 | 60 | 60 | 90 | 60 | 60 | 150 | 60 |
| Thickness of curable resin layer (μm) | 80 | 60 | 100 | 40 | 80 | 40 | 40 | 80 |
| Height of bump (μm) | 200 | 200 | 200 | 200 | 200 | 200 | 200 | 200 |
| Ratio of sum of thickness of curable resin layer and thickness of pressure-sensitive adhesive layer to height of bumps (%) | 70 | 60 | 80 | 65 | 70 | 50 | 95 | 70 |
| Shear elastic modulus of pressure-sensitive adhesive layer (Pa) | $3.0 \times 10^6$ | $3.0 \times 10^6$ | $3.0 \times 10^6$ | $3.0 \times 10^6$ | $3.0 \times 10^6$ | $3.0 \times 10^6$ | $3.0 \times 10^6$ | $3.0 \times 10^6$ |
| Wetting and spreading property of curable resin layer (%) | 160 | 160 | 160 | 160 | 120 | 160 | 160 | 190 |
| Gaps in protective film | B | A | A | A | A | C | A | C |
| Bump apex Exposure characteristic | A | A | A | A | B | A | C | A |

When Examples 1 to 4 and Comparative Example 1 are compared with each other from the above-described results, the wetting and spreading properties of the curable resin layers or the shear elastic moduli of the first pressure-sensitive adhesive layers are identical to one another, but the ratios of the sum of the thickness of the curable resin layer and the thickness of the first pressure-sensitive adhesive layer to the height of the bumps vary. Since a gap is generated in the first protective film in Comparative Example 1 in which the ratio of the sum of the thickness of the curable resin layer and the thickness of the first pressure-sensitive adhesive layer to the height of the bumps is 50%, it is understandable that the ratio of the sum of the thickness of the curable resin layer and the thickness of the first pressure-sensitive adhesive layer to the height of the bumps has an influence on a property of suppressing the generation of gaps in the first protective film.

When Examples 1 to 4 and Comparative Example 2 are compared with each other, the wetting and spreading properties of the curable resin layers or the shear elastic moduli of the first pressure-sensitive adhesive layers are identical to one another, and the thicknesses of the curable resin layers are identical to that in Example 4, but the thicknesses of the first pressure-sensitive adhesive layers vary. Since the bump apex exposure characteristic is poor in Comparative Example 2 in which the thickness of the first pressure-sensitive adhesive layer is 150 μm (the ratio of the thickness of the first pressure-sensitive adhesive layer to the height of the bumps is 75%), it is understandable that the thickness of the first pressure-sensitive adhesive layer has an influence on the bump apex exposure characteristic.

When Example 1, Example 5, and Comparative Example 3 are compared with one another, only the wetting and spreading properties of the curable resin layers vary. Since the property of suppressing the generation of gaps in the first protective film and the bump apex exposure characteristic vary depending on the value of the wetting and spreading property of the curable resin layer, it is understandable that the wetting and spreading property of the curable resin layer has an influence on the property of suppressing the generation of gaps in the first protective film and the bump apex exposure characteristic. It is understandable that, when the wetting and spreading property of the curable resin layer decreases (that is, the curable resin layer becomes harder), the property of suppressing the generation of gaps in the first protective film is further improved, and there is a tendency that the decrease in the wetting and spreading property does not always act advantageously on the bump apex exposure characteristic. On the other hand, it is understandable that, when the wetting and spreading property of the curable resin layer increases as in Comparative Example 3, there are cases in which the property of suppressing the generation of gaps in the first protective film is adversely affected.

INDUSTRIAL APPLICABILITY

The present invention can be used to manufacture semiconductor chips and the like having bumps in a connection pad portion which are used in a flip-chip mounting method.

DESCRIPTION OF THE REFERENCE SYMBOLS

1 . . . first protective film-forming sheet, 11 . . . first base material, 12 . . . curable resin layer (curable resin film), 12' . . . first protective film, 13 . . . first pressure-sensitive adhesive layer, 13a . . . surface of first pressure-sensitive adhesive layer, 101 . . . first supporting sheet, 101a . . . surface of first supporting sheet, 90 . . . semiconductor wafer, 90a . . . circuit surface of semiconductor wafer, 91 . . . bump

The invention claimed is:

1. A first protective film-forming sheet formed by stacking a first pressure-sensitive adhesive layer on a first base material and stacking a curable resin layer on the first pressure-sensitive adhesive layer,
    wherein the curable resin layer is a layer to form a first protective film on a bump-provided surface of a semiconductor wafer by being attached to the surface and cured,
    a sum of a thickness of the curable resin layer and a thickness of the first pressure-sensitive adhesive layer is 110 μm to 170 μm,
    the thickness of the curable resin layer is 60 μm to 100 μm, and
    a wetting and spreading property of the curable resin layer at a temperature of 70° C., a load of 400 gf, and a retention time of five seconds is 150% to 180%.

2. The first protective film-forming sheet according to claim 1,
    wherein a shear elastic modulus of the first pressure-sensitive adhesive layer is $1.0 \times 10^3$ Pa to $1.0 \times 10^8$ Pa.

3. A method for forming a first protective film that protects a circuit surface and bumps of a semiconductor wafer having the bumps formed on the circuit surface, the method comprising:
    a step of attaching a curable resin layer of a first protective film-forming sheet formed by stacking a first pressure-sensitive adhesive layer on a first base material and stacking the curable resin layer on the first pressure-sensitive adhesive layer to the bump-provided surface of the semiconductor wafer;
    a step of heating the curable resin layer;
    a step of laminating the circuit surface and the bumps of the semiconductor wafer;
    a step of forming the first protective film by curing the curable resin layer; and
    a step of peeling the first base material and the first pressure-sensitive adhesive layer,
    wherein a sum of a thickness of the curable resin layer and a thickness of the first pressure-sensitive adhesive layer is 55% or more of a height of the bumps,
    the thickness of the curable resin layer is 10% to 50% of the height of the bumps,
    the thickness of the curable resin layer is 60 μm to 100 μm, and
    a wetting and spreading property of the curable resin layer at a temperature of 70° C., a load of 400 gf, and a retention time of five seconds is 150% to 180%.

4. The method for forming a first protective film according to claim 3,
    wherein a shear elastic modulus of the first pressure-sensitive adhesive layer is $1.0 \times 10^3$ Pa to $1.0 \times 10^8$ Pa.

5. A method for manufacturing a semiconductor chip, the method comprising:
    a step of attaching a curable resin layer of a first protective film-forming sheet formed by stacking a first pressure-sensitive adhesive layer on a first base material and stacking the curable resin layer on the first pressure-sensitive adhesive layer to a bump-provided surface of a semiconductor wafer having bumps formed on the circuit surface;
    a step of heating the curable resin layer;
    a step of laminating the circuit surface and the bumps of the semiconductor wafer;
    a step of forming a first protective film that protects the circuit surface and the bumps by curing the curable resin layer;
    a step of peeling the first base material and the first pressure-sensitive adhesive layer; and
    a step of dicing and dividing the semiconductor wafer together with the first protective film,
    wherein a sum of a thickness of the curable resin layer and a thickness of the first pressure-sensitive adhesive layer is 55% or more of a height of the bumps,
    the thickness of the curable resin layer is 10% to 50% of the height of the bumps,
    the thickness of the curable resin layer is 60 μm to 100 μm, and
    a wetting and spreading property of the curable resin layer at a temperature of 70° C., a load of 400 gf, and a retention time of five seconds is 150% to 180%.

6. The method for manufacturing a semiconductor chip according to claim 5,
    wherein a shear elastic modulus of the first pressure-sensitive adhesive layer is $1.0 \times 10^3$ Pa to $1.0 \times 10^8$ Pa.

7. The first protective film-forming sheet according to claim 1, wherein the curable resin layer comprises:
    an acrylic resin obtained by copolymerizing butyl acrylate, methyl acrylate, glycidyl methacrylate and 2-hydroxyethyl acrylate,
    a bisphenol F-type epoxy resin,
    a polyfunctional aromatic epoxy resin,
    a dicyclopentadiene-type epoxy resin,
    a novolac-type phenolic resin,
    a curing accelerator, and
    a filler.

8. The method for forming a first protective film according to claim 3, wherein the curable resin layer comprises:
    an acrylic resin obtained by copolymerizing butyl acrylate, methyl acrylate, glycidyl methacrylate and 2-hydroxyethyl acrylate,
    a bisphenol F-type epoxy resin,
    a polyfunctional aromatic epoxy resin,
    a dicyclopentadiene-type epoxy resin,
    a novolac-type phenolic resin,
    a curing accelerator, and
    a filler.

9. The method for manufacturing a semiconductor chip according to claim 5, wherein the curable resin layer comprises:
    an acrylic resin obtained by copolymerizing butyl acrylate, methyl acrylate, glycidyl methacrylate and 2-hydroxyethyl acrylate,
    a bisphenol F-type epoxy resin,
    a polyfunctional aromatic epoxy resin,
    a dicyclopentadiene-type epoxy resin,
    a novolac-type phenolic resin,
    a curing accelerator, and
    a filler.

* * * * *